US011245003B2

(12) United States Patent
Arthur et al.

(10) Patent No.: US 11,245,003 B2
(45) Date of Patent: Feb. 8, 2022

(54) SYSTEMS AND METHODS FOR JUNCTION TERMINATION OF WIDE BAND GAP SUPER-JUNCTION POWER DEVICES

(71) Applicant: General Electric Company, Schenectady, NY (US)

(72) Inventors: Stephen Daley Arthur, Glenville, NY (US); Victor Mario Torres, Clifton Park, NY (US); Michael J. Hartig, Schenectady, NY (US); Reza Ghandi, Niskayuna, NY (US); David Alan Lilienfeld, Niskayuna, NY (US); Alexander Viktorovich Bolotnikov, Niskayuna, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 4 days.

(21) Appl. No.: 16/517,193

(22) Filed: Jul. 19, 2019

(65) Prior Publication Data

US 2020/0203477 A1 Jun. 25, 2020

Related U.S. Application Data

(60) Provisional application No. 62/783,683, filed on Dec. 21, 2018.

(51) Int. Cl.
*H01L 29/15* (2006.01)
*H01L 31/0312* (2006.01)
(Continued)

(52) U.S. Cl.
CPC ...... *H01L 29/0634* (2013.01); *H01L 21/0465* (2013.01); *H01L 29/0619* (2013.01);
(Continued)

(58) Field of Classification Search
CPC ............ H01L 29/0634; H01L 21/0465; H01L 29/66068; H01L 29/0619; H01L 29/0623;
(Continued)

(56) References Cited

U.S. PATENT DOCUMENTS 6,274,904 B1 * 8/2001 Tihanyi ............... H01L 29/0619
257/256
6,861,706 B2 * 3/2005 Tihanyi ............... H01L 29/0634
257/342
(Continued)

FOREIGN PATENT DOCUMENTS

WO 2017105414 A1 6/2017

OTHER PUBLICATIONS

Temple, Victor A. K.; "Junction Termination Extension for Near-Ideal Breakdown Voltage in p-n Junctions", Oct. 1986, pp. 1601-1608, vol. ED-33, No. 10.
(Continued)

*Primary Examiner* — Ismail A Muse
(74) *Attorney, Agent, or Firm* — Fletcher Yoder, P.C.

(57) ABSTRACT

A disclosed super-junction (SJ) device includes a first epitaxial (epi) layer that forms a first SJ layer of the SJ device, and includes a second epi layer disposed on the first SJ layer that forms a device layer of the SJ device. An active area of the first and second epi layers includes a first set of SJ pillars comprising a particular doping concentration of a first conductivity type and a second set of SJ pillars comprising the particular doping concentration of a second conductivity type. A termination area of the first and second epi layers has a minimized epi doping concentration of the first conductivity type that is less than the particular doping concentration, and the termination area of the second epi layer
(Continued)

includes a plurality of floating regions of the second conductivity type that form a junction termination of the SJ device.

21 Claims, 17 Drawing Sheets

(51) Int. Cl.
  *H01L 29/06* (2006.01)
  *H01L 29/16* (2006.01)
  *H01L 21/04* (2006.01)
  *H01L 29/66* (2006.01)
(52) U.S. Cl.
  CPC ...... *H01L 29/0623* (2013.01); *H01L 29/1608* (2013.01); *H01L 29/66068* (2013.01)
(58) Field of Classification Search
  CPC ............. H01L 29/1608; H01L 29/7811; H01L 29/0615
  See application file for complete search history.

(56) References Cited

U.S. PATENT DOCUMENTS

| | | | | |
|---|---|---|---|---|
| 7,161,209 B2* | 1/2007 | Saito | ................... | H01L 29/0634 257/328 |
| 7,622,771 B2* | 11/2009 | Ono | ................... | H01L 29/0634 257/341 |
| 7,687,851 B2* | 3/2010 | Hshieh | ................... | H01L 29/456 257/330 |
| 7,737,469 B2* | 6/2010 | Saito | ................... | H01L 29/7395 257/197 |
| 7,955,929 B2* | 6/2011 | Stefanov | ................... | H01L 29/66719 438/268 |
| 8,013,360 B2* | 9/2011 | Saito | ................... | H01L 29/7397 257/197 |
| 2007/0272979 A1* | 11/2007 | Saito | ................... | H01L 29/7722 257/335 |
| 2008/0290403 A1* | 11/2008 | Ono | ................... | H01L 29/7811 257/329 |
| 2009/0090967 A1 | 4/2009 | Chen et al. | | |
| 2010/0078775 A1* | 4/2010 | Mauder | ................ | H01L 29/0878 257/655 |
| 2010/0200936 A1* | 8/2010 | Saito | ................... | H01L 29/8611 257/409 |
| 2012/0276701 A1 | 11/2012 | Yedinak et al. | | |
| 2014/0231969 A1* | 8/2014 | Mauder | ................... | H01L 29/36 257/655 |
| 2015/0115284 A1* | 4/2015 | Arthur | ................ | H01L 29/0646 257/77 |
| 2016/0307997 A1* | 10/2016 | Arthur | ................ | H01L 29/1608 |
| 2016/0380059 A1* | 12/2016 | Losee | ................. | H01L 29/0634 257/77 |
| 2017/0200784 A1* | 7/2017 | Shirakawa | ........... | H01L 29/7803 |
| 2017/0278924 A1 | 9/2017 | Bolotnikov et al. | | |
| 2017/0365669 A1* | 12/2017 | Kim | ................... | H01L 29/0623 |
| 2018/0166531 A1* | 6/2018 | Bolotnikov | ....... | H01L 21/26546 |
| 2019/0006529 A1* | 1/2019 | Bolotnikov | ......... | H01L 29/0623 |

OTHER PUBLICATIONS

Kimoto, Tsunenobu, et al.; "Fundamentals of Silicon Carbide Technology: Growth, Characterization, Devices and Applications", Nov. 24, 2014, pp. 1-4, Wiley-IEEE Press.
Bolotnikov, Alexander; "SiC Charge-Balanced Devices Offering Breakthrough Performance Surpassing the 1-D Ron versus BV Limit", 2018, pp. 1-4.
Koo, Yoon-Mo, et al.; "The Analysis of the Breakdown Voltage According to the Change of JTE Structures and Design Parameters of 4H—SiC Device", j.inst.Korean.electr.electron.eng., Dec. 2015, vol. 19, No. 4, pp. 491-499.
International Search Report/Written Opinion; PCT/US0219/068117 dated Apr. 29, 2020, 13 pages.

* cited by examiner

SYSTEMS AND METHODS FOR JUNCTION TERMINATION OF WIDE BAND GAP SUPER-JUNCTION POWER DEVICES

CROSS-REFERENCE TO RELATED APPLICATIONS

This application claims priority to U.S. Patent Provisional Application No. 62/783,683, entitled "SYSTEMS AND METHODS FOR JUNCTION TERMINATION IN SEMICONDUCTOR DEVICES," filed Dec. 21, 2018, which is herein incorporated by reference in its entirety for all purposes.

BACKGROUND

The subject matter disclosed herein relates to wide band gap power devices (e.g., silicon carbide (SiC) power devices) and, more specifically, to termination designs for wide band gap super-junction (SJ) power devices.

For a semiconductor power device, a termination, such as a junction termination, can be used to generally prevent electric field crowding near the edges of an active area of the device during reverse bias operation. As used herein, the term "junction termination" is meant to encompass termination structures that employ p/n junctions, either floating or electrically attached to the primary blocking junction, as a means for shaping and controlling the electric field surrounding the active area of a device. However, while terminations improve device reliability and operation, there is also a cost associated with using terminations. For instance, terminations generally occupy a certain amount of the die area of a semiconductor power device, referred to herein as a termination area. Along with other portions of the device (e.g., a gate bus region, a gate pad region, etc.), the termination area contributes to what is referred to herein as the overhead area of the device. As such, while the active area of the device includes device cells (e.g., metal-oxide-semiconductor field-effect transistors (MOSFET) cells) for power conversion, the overhead area includes features that support operation of these device cells.

Accordingly, it may be desirable to maximize a ratio of the active area to the overhead area of a device to enhance performance. A wide termination results in a large termination area, and a large overhead area, and this limits the amount of die area available for the active area of the device. Accordingly, by reducing the overhead area, the ratio of the active area to overhead area may be increased, which can improve the efficiency and/or operation of the device.

BRIEF DESCRIPTION

In an embodiment, a super-junction (SJ) device includes a first epitaxial (epi) layer that forms a first SJ layer of the SJ device, and includes a second epi layer disposed on the first SJ layer that forms a device layer of the SJ device. An active area of the first and second epi layers includes a first set of SJ pillars comprising a particular doping concentration of a first conductivity type and a second set of SJ pillars comprising the particular doping concentration of a second conductivity type. A termination area of the first and second epi layers has a minimized epi doping concentration of the first conductivity type that is less than the particular doping concentration, and the termination area of the second epi layer includes a plurality of floating regions of the second conductivity type that form a junction termination of the SJ device.

In another embodiment, a method of manufacturing a super-junction (SJ) device includes forming a first SJ layer by: forming a first epitaxial (epi) layer on an underlying layer, wherein the first epi layer has a minimized epi doping concentration of a first conductivity type; implanting an active area of the first epi layer with a first set of SJ pillars to yield a particular doping concentration of the first conductivity type, wherein the particular doping concentration is greater than the minimized epi doping concentration; and implanting the active area of the first epi layer to yield a second set of SJ pillars comprising the particular doping concentration of a second conductivity type. The method also includes forming a device layer by: forming a second epi layer on the first SJ layer, wherein the second epi layer has the minimized epi doping concentration of the first conductivity type; implanting an active area of the second epi layer with a first set of device layer pillars to yield a second doping concentration of the first conductivity type that is less than the particular doping concentration; implanting the active area of the second epi layer with a second set of device layer pillars to yield the particular doping concentration of the second conductivity type; and forming a junction termination in the device layer by implanting a termination area of the second epi layer with a plurality of floating regions having the second conductivity type.

In another embodiment, a silicon carbide (SiC) super-junction (SJ) device includes a first super-junction (SJ) layer formed in a first epitaxial (epi) layer of the SiC-SJ device, wherein a termination area of the first epi layer has a minimized epi doping concentration of a first conductivity type, wherein the minimized epi doping concentration is less than or equal to $1.5 \times 10^{15}$ cm$^{-3}$. The SiC-SJ device also includes a device layer formed in a second epi layer of the SiC-SJ device, wherein the second epi layer is disposed on the first SJ layer, and wherein a termination area of the device layer has the minimized epi doping concentration of the first conductivity type and a plurality of floating regions of a second conductivity type that form a junction termination of the SiC-SJ device.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
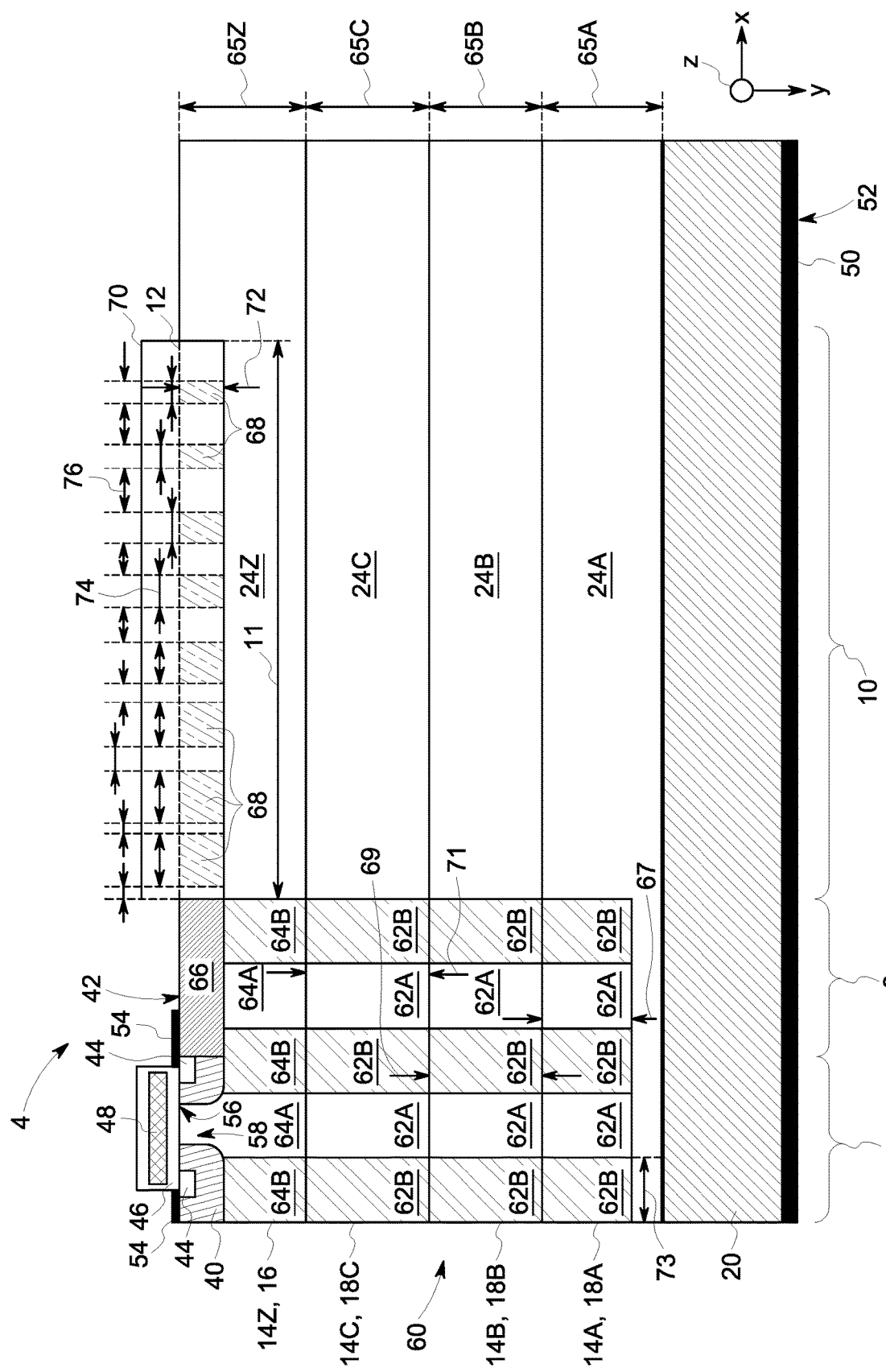
FIG. 1 is a schematic diagram illustrating a cross-sectional view of a portion of an embodiment of a multi-layer silicon carbide super-junction (SiC-SJ) device having a termination area that includes a junction termination with floating regions of doping, in accordance with aspects of the present technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. If ranges are disclosed, the endpoints of all ranges directed to the same component or property are inclusive and independently combinable. The modifier "about" used in connection with a quantity is inclusive of the stated value and has the meaning dictated by the context (e.g., includes the degree of process variations or errors associated with measurement of the particular quantity). The modifier "substantially," when used in combination with a descriptive term, is intended to convey that the descriptive terms mostly, mainly, or predominately applies (e.g., applies to greater than 90%, greater than 95%, or greater than 99% of the time), and may be used to account for limited exceptions that may result from process variations and technical limitations understood by those of the art.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. The term "adjacent" as used herein means that the two layers or features are disposed contiguously and in direct contact with each other. In the present disclosure, when a layer/device is being described as "on" another layer or substrate, it is to be understood that the layers/devices can either be directly contacting each other or have one (or more) layer or feature between the layers and devices. Further, the term "on" describes the relative position of the layers/devices to each other and does not necessarily mean "on top of" since the relative position above or below depends upon the orientation of the device to the viewer. Moreover, the use of "top," "bottom," "above," "below," "upper", "buried" and variations of these terms is made for convenience and does not require any particular orientation of the components unless otherwise stated. With this in mind, as used herein, the terms "lower," "buried," "middle," or "bottom" refer to a feature (e.g., epitaxial layer, termination area) that is relatively nearer the substrate layer, while the terms "top" or "upper" refer to the particular feature (e.g., epitaxial layer, termination area) that is relatively the farthest from the substrate layer.

Present embodiments are directed toward designs and methods for manufacturing wide band gap super-junction (SJ) power devices, such as silicon carbide super-junction (SiC-SJ) power devices. The disclosed designs and methods are useful in the manufacture of SJ devices, such as metal-oxide-semiconductor field-effect transistors (MOSFETs), junction field effect transistors (JFETs), bipolar junction transistors (BJTs), diodes, as well as other SJ devices that may be useful for medium-voltage (e.g., 2 kV-10 kV) and high-voltage (e.g., greater than or equal to 10 kV) power conversion related applications. As discussed below, the disclosed SJ device designs include multi-layered termination areas implemented using repeated epitaxial growth and dopant implantation steps. As used herein, the term "multi-layered," as well as references to a particular number of layers, for example, "two-layered," "three-layered," "four-layered," refer to the number of epitaxial layers, also referred to herein as epi layers.

More specifically, present embodiments are directed toward designs and methods for manufacturing power device terminations, such as junction terminations, for wide band gap SJ devices (e.g., SiC-SJ devices). As mentioned, junction terminations are termination structures that employ p/n junctions, either floating or electrically attached to the primary blocking junction, as the means for shaping and controlling the electric field surrounding the device active area. Generally, the disclosed termination designs satisfy a number of design parameters to provide effective edge termination for wide band gap SJ device. For example, the disclosed termination designs provide a breakdown voltage that is close to or at (e.g., 90% or more) device entitlement while reducing termination widths. The disclosed termination designs are also relatively robust to process variations (e.g., dopant concentration in the implanted regions, dopant concentration in the epitaxial layers, doping activation percentage, etc.). The disclosed termination designs consume a smaller portion of the die area, relative to typical junction termination designs, and are relatively low-cost to fabricate. For example, certain disclosed SJ device embodiments may be manufactured using common semiconductor fabrication equipment, such as high-volume ion implantation systems used by existing Si/SiC device manufacturing, to provide additional cost benefits.

As discussed in detail below, the disclosed SJ termination designs include one or more regions of n-type and/or p-type doping arranged in specific ways to form a junction termination, such as a junction termination extension (JTE), to allow gradual reduction of the magnitude of the electric field outside of the active area (e.g., a conductive region) of a SJ power device under reverse bias conditions. In various embodiments, these regions of doping may be implemented as disconnected blocks, continuous pillars, stripes, segments, grids, dots, or any other suitable shape. In certain embodiments, these regions of doping may be described as "floating," meaning that they are in not in electrical contact with a device terminal or under an external applied bias; however, in other embodiments at least a portion of these regions may be in electrical contact with a device terminal. The positions and dimensions of these implanted regions in the termination area of the disclosed SJ devices are designed to achieve a high blocking voltage, to prevent premature device breakdown that results from electric field crowding effects, and to allow reliable operation of these devices particularly when subjected to long-term high-temperature/high-voltage operation. Moreover, by controlling the doping of epitaxial (epi) layers within the active area of a SJ device using high-energy ion implantation, for example, and by controlling the epi doping in the termination area of the device, the disclosed termination designs occupy significantly less die area than traditional junction termination designs, substantially increasing the active area to overhead area ratio, without a performance penalty in terms of breakdown voltage.

It may be appreciated that, for present embodiments, the epi layers of the SJ devices may be formed with the lowest controllable doping level, for example, without any intentional epi doping (e.g., without intentionally introducing any dopants) or at minimal doping level that allows control of the type (n or p) within specified low concentration range. However, it is recognized since impurities, such as nitrogen, may be present in machinery and/or tools used during the epitaxial growth process, the epi layers may still include a low amount of epi doping (e.g., of the first conductivity type, n-type), which is referred to herein a "minimized epi doping concentration." Accordingly, while the epi layers may be formed with no intentional doping concentration, the actual epi doping concentration of epi layers may be generally $8.0 \times 10^{13}$ cm$^{-3}$ or more, depending on the equipment used for epitaxial growth. For example, in certain embodiments discussed below, the minimized epi doping concentration of the first conductivity type (e.g., n-type) may be less than $3.0 \times 10^{"}$ cm$^{-3}$, less than $2 \times 10^{"}$ cm$^{-3}$, less than $1 \times 10^{15}$ cm$^{-3}$, or between $8 \times 10^{13}$ cm$^{-3}$ and $2 \times 10^{15}$ cm$^{-3}$. For example, when the first conductivity type is n-type, nitrogen, phosphorous, arsenic, antimony, and/or the like may be used as the dopant. Alternatively, when the first conductivity type is p-type, boron, aluminum, and/or the like may be used as the dopant.

As discussed below, after each epi layer is formed having this minimized epi doping concentration, portions of the active area the device are implanted with dopant of the first conductivity type and the second conductivity type using high-energy (HE) implantation operations to form the SJ pillars of the SJ layers. Additionally, a top or device epi layer may also be implanted one or more times to form device structures (e.g., well regions, source regions, etc.), and these implantation operations may be performed using a standard energy implantation process in certain embodiments. For example, after forming the SJ pillars using HE implantation operations in an epi layer having the minimized epi doping concentration (e.g., less than or equal to $3 \times 10^{15}$ cm$^{-3}$), a portion of the SJ pillars of the active region of an epi layer have a particular doping concentration (e.g., greater than or equal to $5 \times 10^{15}$ cm$^{-3}$) of the first dopant type, while the remaining SJ pillars may have the particular doping concentration (e.g., greater than or equal to $5 \times 10^{15}$ cm$^{-3}$) of the second dopant type. Additionally, as discussed below, in certain embodiments, certain SJ pillars may include a modified portion having a relatively reduced doping concentration, wherein the reduced doping concentration and a depth of the modified portion also affect the breakdown properties of the SJ device.

With the foregoing in mind, FIG. 1 illustrates a cross-sectional view of an embodiment of a SiC-SJ device 4 having an active area 6 and an intermediate area 8, as well as a termination area 10 having a junction termination, such as a junction termination extension (JTE) 12, in accordance with embodiments of the present approach. It may be appreciated that, in order to more clearly illustrate certain components of the SiC-SJ device 4, certain commonly understood design elements (e.g., top metallization, passivation, and so forth) may be omitted. It may also be appreciated that, while the device 4 is described herein in the context of a SiC-SJ device, in other embodiments, other wide band gap materials (e.g., germanium (Ge), aluminum nitride (AlN), gallium nitride (GaN), boron nitride, gallium arsenide (GaAs), diamond (C), etc.) may be used, in accordance with the present disclosure.

The illustrated embodiment of the SiC-SJ device 4 includes a number of epitaxial (epi) layers 14. These include epi layer 14Z that forms a device layer 16 of the SiC-SJ device 4, as well as epi layers 14A, 14B, and 14C that respectively form super-junction (SJ) layers 18A, 18B and 18C of the SiC-SJ device 4. While the illustrated embodiment includes four epi layers 14, in other embodiments, the SiC-SJ device 4 may include any suitable number of epi layers 14 (e.g., 2, 3, 4, 5, 6, or more) to yield a SiC-SJ device 4 having a particular desired voltage rating. The epi layers 14 may be fabricated using repeated cycles of epitaxial overgrowth. As illustrated, the first epi layer 14A is formed and disposed directly on a substrate layer 20, and the second epi layer 14B is formed and disposed directly on the first epi layer 14A. Further, the third epi layer 14C is formed and disposed directly on the second epi layer 14B, and the fourth epi layer 14Z (e.g., the device epi layer) is formed and disposed directly on the third epi layer 14C. In other embodiments, the SiC-SJ device 4 may include additional epi layers 14 (e.g., 14D, 14E, 14F, and so forth), including any suitable number of SJ layers 18, intervening between the first epi layer 14A and the device epi layer 14Z and/or disposed below the first epi layer 14A.

For the embodiment illustrated in FIG. 1, in the active area 6, a top surface 42 of the device layer 16 includes a well region 40 having a second conductivity type (e.g., a p-well region 40) disposed adjacent to a source region 44 having the first conductivity type (e.g., n-type source region 44). A dielectric layer 46 (also referred to as a gate insulating layer or gate dielectric layer) is disposed adjacent to the device layer 16, and a gate electrode 48 is disposed adjacent to the dielectric layer 46. Further, the SJ layer 18 is disposed on the substrate layer 20 (e.g., a semiconductor substrate layer, a wide band gap substrate layer), and a drain contact 50 is disposed on the bottom 52 of the SiC-SJ device 4, adjacent to the substrate layer 20. As additionally illustrated in the embodiment of FIG. 1, a source contact 54 is disposed adjacent to the top surface 42 of the device layer 16, and is disposed on a portion of both the source region 44 and the well region 40 of the device layer 14Z.

During on-state operation of the illustrated SiC-SJ device 4, an appropriate gate voltage (e.g., at or above a threshold voltage ($V_{TH}$) of the SiC-SJ device 4) causes an inversion layer form in a channel region 56, as well as a conductive path to be enhanced in a junction field-effect transistor (JFET) region 58, due to accumulation of carriers, allowing current to flow from the drain contact 50 (e.g., drain electrode, drain terminal) to the source contact 54 (e.g., source electrode, source terminal) within portions of the active area 6 and/or in the intermediate area 8. The channel region 56 may be generally defined as an upper portion of the well region 40 disposed below the gate electrode 48 and the dielectric layer 46.

To reduce on-state resistance (Rds(on)) and resultant on-state conduction losses, the SiC-SJ device 4 includes a SJ region 60, which may have any suitable number of SJ layers 18, formed in the active area 6 and/or the intermediate area 8 of the SiC-SJ device 4. Each of the SJ layers 18 includes a first set of implanted SJ pillars 62A oppositely doped relative to a second set of implanted SJ pillars 62B. In other words, the first set of SJ pillars 62A have a first conductivity type (e.g., n-type SJ pillars 62), while the second set of SJ pillars 62B have a second conductivity type (e.g., p-type SJ pillars 62). In some embodiments, the first set of SJ pillars 62A may be doped with nitrogen, phosphorous, or another suitable n-type dopants, while the second set of SJ pillars 62B are doped with boron, aluminum, or another suitable p-type dopant, or vice versa.

Further, the dopant concentration in the first set of SJ pillars 62A and in the second set of SJ pillars 62B of the SJ region 60 is approximately the same (e.g., ±3%, ±2%, ±1%). For example, in some embodiments, each of the first set of SJ pillars 62A and each of the second set of SJ pillars 62B may have a dopant concentration greater than $5\times10^{15}$ cm$^{-3}$ and/or less than $1\times10^{17}$ cm$^{-3}$. In some embodiments, the first set of SJ pillars 62A and the second set of SJ pillars 62B are each generally designed to substantially deplete and to generally provide similar amounts (e.g., substantially equal amounts) of effective charge (e.g., per cm$^2$, normalized to device active area 6) from ionized dopants under reverse bias. Accordingly, the illustrated super-junction structure allows the SiC-SJ device 4 to achieve high breakdown voltage and low on-state resistance, since the p-type semiconductor portions and the n-type semiconductor portions are both substantially (e.g., completely) depleted under nominal blocking conditions.

The first epi layer 14A, the second epi layer 14B, the third epi layer 14C, and the device epi layer 14Z have respective thicknesses 65A, 65B, 65C, and 65Z, which may be the same or different, in certain embodiments. For instance, in certain embodiments, the thicknesses 65 (e.g., 65A, 65B, 65C, and 65Z) of the epi layers 14 may be between 2 microns (μm) and 15 μm (e.g., 10 μm or 12 μm). Additionally, the SJ pillars 62 in the SJ region 60 of the illustrated SiC-SJ device 4 have a particular depth (e.g., extending along the Y-axis). It should be appreciated that, in some embodiments, the depth of the SJ pillars 62 may be the same between the first set of SJ pillars 62A and the second set of SJ pillars 62B. In some embodiments, for example, each of the SJ pillars 62 may extend through the entire thickness 65A of the epi layer 14A and may contact (e.g., electrically couple to) the substrate layer 20. Alternatively, each of the SJ pillars 62 may not extend through the entire thickness 65A of the first epi layer 14A, leaving a gap (e.g., a region of epi doping) between the SJ pillars 62 and the substrate layer 20. Moreover, in some embodiments, each of the first set of SJ pillars 62A may contact (e.g., electrically couple to) at least one of a first set of device layer pillars 64A having a like conductivity type (e.g., a n-type device layer pillars), and each of the second set of SJ pillars 62B may contact (e.g., electrically couple to) at least one of a second set of device layer pillars 64B having a like conductivity type (e.g., a p-type device layer pillars), as described in greater detail below. It may be appreciated that since the first set of device layer pillars 64A and the second set of device layer pillars 64B are not charge balanced due to the other structures in the device layer, these device layer pillars are technically not themselves SJ structures. However, as a matter of convenience, device layer pillars 64A and 64B may be described herein as being part of the SJ pillars 62A and 62B, respectively, for certain embodiments.

Further, the depth of the SJ pillars 62 may be different in different SJ layers 18 of the SJ region 60. For example, as illustrated in FIG. 1, each of the first set of SJ pillars 62A and the second set of SJ pillars 62B in the first SJ layer 18A has a depth 67, while each of the first set of SJ pillars 62A and the second set of SJ pillars 62B in the second SJ layer 18B has a depth 69. The first set of SJ pillars 62A and the second set of SJ pillars 62B in the second SJ layer 18B extend through the entire thickness 65B of the epi layer 14B. By extending through the thickness 65B of the epi layer 14B, continuous, vertical SJ pillars 62 may be formed from each of the SJ layers 18 in the SJ region 60. The continuous, vertical SJ pillars 62 may then provide low conduction losses and high blocking voltages. It should be appreciated that, for the illustrated embodiment, a total depth of the first set of SJ pillars 62A is equivalent to the sum of the respective depths (e.g., 67, 69, and 71) of the first set of SJ pillars 62A in the first SJ layer 18A, second SJ layer 18B, and third SJ layer 18C. Similarly, a total depth of the second set of SJ pillars 62B is equivalent to the sum of the respective depths (e.g., 67, 69, and 71) of the second set of SJ pillars 62B in the first SJ layer 18A, the second SJ layer 18B, and the third SJ layer 18C.

With respect to dimensions, each of the SJ pillars 62 may have a particular width 73. In certain embodiments, the dimensions (e.g., width 73) of the SJ pillars 62 may vary along the Y-axis. Moreover, the dimensions of the first set of SJ pillars 62A may vary with respect to the dimensions of the second set of SJ pillars 62B. Further, the SJ pillars 62 may have different cross-sectional shapes (e.g., defined by the set of masks used during implantation). However, the dimensions of the first set of SJ pillars 62A in the first SJ layer 18A generally match the dimensions of a corresponding first set of SJ pillars 62A in the other SJ layers 18 (e.g., SJ layer 18B). Similarly, the dimensions of the second set of SJ pillars 62B in the first SJ layer 18A may match the dimensions of a corresponding second set of SJ pillars 62B in the other SJ layers 18 (e.g., SJ layer 18B), such that the corresponding first sets of SJ pillars 62A and the corresponding second sets of SJ pillars 62B of each of the SJ layers 18 are in alignment with each other.

Further, it should be appreciated that the doping of the epi layers 14, the doping of the SJ pillars 62, the thicknesses 65 of the epi layers 14, the depth (e.g., 67, 69, 71) of the SJ pillars 62, and the width 73 of the SJ pillars 62 may be varied for different embodiments to enable desired electrical performance (e.g., desired breakdown voltage) of the SiC-SJ devices 4. For example, in some embodiments, certain device parameters (e.g., the thickness 65 and doping of the epi layers 14) may be selected to provide a breakdown voltage of the SiC-SJ device 4 that is between approximately 1 kilovolt (kV) and 10 kV, 1 kV and 5 kV, or any other suitable range. Further, in some embodiments, the dopant concentration of the SJ pillars 62 may be between approximately $5\times10^{15}$ cm$^{-3}$ and approximately $1\times10^{17}$ cm$^{-3}$. Moreover, in some embodiments, the SiC-SJ device 4 may include fewer or additional SJ layers 18 (e.g., two SJ layers 18, three SJ layers 18, four SJ layers 18, and/or the like) to achieve a desired voltage rating, for example.

Fabricating continuous, vertical super-junction pillars that extend through the thickness 65 of one or more epi layers 14 may be challenging for certain semiconductor materials having low diffusion coefficients of dopants. For example, fabricating such SJ pillars 62 may be challenging for embodiments in which the epi layers 14 are fabricated from SiC, which has lower diffusion coefficients for dopants compared to silicon (Si). For example, in order to form SJ pillars 62 (and device pillars 64) that, at least in some cases, extend through the entire thickness 65 of one or more epi layers 14, as present in a full SJ device, numerous (e.g., 10+) thin epitaxial growth/shallow ion implantation steps may be performed. Moreover, a combination of low energy implantation (e.g., implant acceleration energies less than 0.5 mega-electron volts (MeV)) and high energy implantation (e.g., implant acceleration energies greater than 0.5 MeV) may be used to implant the SJ pillars 62. For example, implant acceleration energies greater than 0.1 MeV and/or less than 50 MeV may be used. For instance, in some embodiments, an implant acceleration energy between 0.1 MeV and 30 MeV may be employed. Accordingly, the projected range (e.g., the penetration depth) of most commonly used SiC dopants (e.g., boron, nitrogen, phosphorus, aluminum) is approximately between 2 microns (µm) and 15 µm, which is at least suitable for implantation of the SJ pillars 62 through epi layers 14 having a thickness between 2 µm and 15 µm. Further, in some embodiments, a suitable high energy masking material (e.g., silicon on insulator (SOI), polysilicon, thick silicon oxide, and high-Z metals) may be employed during the implantation of the SJ pillars 62 and device pillars 64, as described in greater detail below.

Additionally, for the embodiment illustrated in FIG. 1, the device layer 16 includes the first set of device layer pillars 64A and the second set of device layer pillars 64B implanted in the active area 6 and the intermediate area 8. The first set of device layer pillars 64A has the same conductivity as the first set of SJ pillars 62A, while the second set of device layer pillars 64B has the same conductivity as the second set of SJ pillars 62B. Accordingly, the first set of device layer pillars 64A are oppositely doped relative to a second set of device layer pillars 64B. In other words, the first set of device layer pillars 64A have the first conductivity type (e.g., n-type device layer pillars 64), while the second set of device layer pillars 64B have the second conductivity type (e.g., p-type device layer pillars 64). Moreover, as illustrated, the first set of device layer pillars 64A is in contact with, and electrically coupled to, the first set of SJ pillars 62A in the third epi layer 14C (e.g., the SJ layer 18C). Further, the second set of device layer pillars 64B is in contact with, and electrically coupled to, the second set of SJ pillars 62B in the third epi layer 14C (e.g., the SJ layer 18C), the well region 40 having the same conductivity type as the second set of device layer pillars 64B, and/or the well region 66 in the intermediate area 8 having the same conductivity type as the second set of device layer pillars 64B. Accordingly, in some embodiments, the first set of device layer pillars 64A and/or the second set of device layer pillars 64B may be implanted according to any suitable means, such as using high energy implantation, lower energy implantation, or a combination thereof, as described above with reference to the set of SJ pillars 62.

In some embodiments, the dopant concentration in the first set of device layer pillars 64A and in the second set of device layer pillars 64B of the device layer 16 is approximately the same (e.g., ±3%, ±2%, ±1%). For example, in some embodiments, the first set of SJ pillars 62A and the second set of SJ pillars 62B are each generally designed to substantially deplete and to generally provide similar amounts (e.g., substantially equal amounts) of effective charge (e.g., per cm$^2$, normalized to device active area 6) from ionized dopants under reverse bias. Further, in some embodiments, the dopant concentration in the first set of device layer pillars 64A and in the second set of device layer pillars 64B of the device layer 16 is approximately the same (e.g., ±3%, ±2%, ±1%) as the dopant concentration in the first set of SJ pillars 62A and the second set of SJ pillars 62B. In such embodiments, the first set of device layer pillars 64A and the second set of device layer pillars 64B may be included within the first set of SJ pillars 62A and the second set of SJ pillars 62B, respectively, and a SJ layer 18Z or a partial SJ layer may be formed within the device layer 16.

In other embodiments, the dopant concentration in the first set of device layer pillars 64A is different from the dopant concentration in the second set of device layer pillars 64B of the device layer 16. For example, the dopant concentration in the second set of device layer pillars 64B may be approximately the same (e.g., ±3%, ±2%, ±1%) as the dopant concentration in the second set of SJ pillars 62B, while the dopant concentration in at least one of the first set of device layer pillars 64A may be lower than the dopant concentration in the second set of device layer pillars 64B and/or the dopant concentration in the first set of SJ pillars 62A, as discussed below with respect to FIGS. 13-18. In such embodiments, while the specific on-state resistance of the SiC-SJ device 4 may be greater than SiC-SJ devices 4 having substantially equal dopant concentrations in the first set of device layer pillars 64A and the second set of device layer pillars 64B, premature avalanche breakdown at the intersection of the termination area 10 and the intermediate area 8 and/or active area 6 may be reduced. Accordingly, as discussed below, the maximum breakdown voltage of the SiC-SJ device 4 may be increased compared to other device designs.

As mentioned, termination regions 24 disposed in the termination area 10 of the SiC-SJ device 4 may have a doping concentration of the first conductivity type that corresponds to the minimized epi doping concentration. Further, as discussed in greater detail below, within the active area 6 and/or the intermediate area 8, the doping concentration of the first set of SJ pillars 62A and the second set of SJ pillars 62B is substantially greater (e.g., 2×, 3×, 5×, 10×, or more) than the minimized epi doping concentration of the termination regions 24. For example, in some embodiments, the doping concentration of the first conductivity type in the first set of SJ pillars 62A and the doping concentration of the second conductivity type in the second set of SJ pillars may be greater than or equal to $5 \times 10^{15}$ per cubic centimeter ($cm^{-3}$) and/or less than $1 \times 10^{17}$ $cm^{-3}$, such as $1.0 \times 10^{16}$ $cm^{-3}$. Moreover, within a certain device area (e.g., the termination area 10, the intermediate area 8, and/or the active area 6,) the doping concentration of the first conductivity type in the portions of the epi layers (e.g., the termination regions 24, the first set of SJ pillars 62A, and/or the second set of SJ pillars 62B, respectively) may be the same or different.

For the embodiment illustrated in FIG. 1, the termination area 10 includes a junction termination, namely a JTE 12, in the termination region 24Z of the device layer 16. In some embodiments, the JTE 12 includes a number of implanted regions of a dopant having the second conductivity type (e.g., p-type), that extend a width 11 from the intermediate area 8 and are utilized to reshape the electric field in at least the termination area 10 of the SiC-SJ device 4. In certain embodiments, these implanted regions include floating regions 68, which are implemented in the form of disconnected, implanted dopant blocks in the SiC-SJ device 4 of FIG. 1. When the floating regions 68 are arranged as disclosed, they gradually reduce the strength of the electric field outside of the active area 6 of the SiC-SJ device 4 during high-voltage blocking operation. Additionally, the SiC-SJ device 4 may also include a number of passivation layers 70 disposed on the device layer 16 in the termination area 10, which may be formed from one or more dielectric materials that aid in reducing the electric field above the device layer 16.

As mentioned, the floating regions 68 of the illustrated SiC-SJ device 4 are regions having opposite conductivity type relative to the minimized epi doping of the epi layer 14Z (e.g., the termination region 24Z), in which they reside. When the embodiment of the SiC-SJ device 4 illustrated in FIG. 1 is in an OFF-state under reverse bias, floating regions 68 deplete to provide ionized dopants (immobile charges) that, when suitably sized, shaped, and positioned relative to the X-axis and the Z-axis, allow the electric field to be reshaped within periphery of the SiC-SJ device 4 (e.g., within the termination area 10). More specifically, when floating regions 68 deplete under reverse bias, they prevent electric field peaks and provide electric field distributions with a magnitude that gradually decreases with increasing distance from the active area 6 of the SiC-SJ device 4. The particular electric field distribution in the termination area 10 of the SiC-SJ device 4 under reverse bias depends, for example, on the distribution of dopants (e.g., dopant concentration, the dimensions and positions of the floating regions 68).

For the embodiment of the SiC-SJ device 4 illustrated in FIG. 1, the floating regions 68 have a particular depth 72. In other embodiments, the floating regions 68 may extend through the entire thickness of the device epitaxial layer 14Z (e.g., thickness 65Z). Additionally, for the illustrated embodiment of FIG. 1, the widths 74 of the floating regions 68, and the spacing 76 between the floating regions 68 in the termination area 10 changes (e.g., decreases or increases) with increasing distance from the active area 6 of the SiC-SJ device 4 to provide a gradual decrease in effective sheet doping concentration in the termination area 10. It may be appreciated that, in other embodiments, the widths 74 of the floating regions 68 substantially decrease with increasing distance from the active area 6, while the spacing 76 between the floating regions 68 remains substantially constant. In still other embodiments, the spacing 76 between the floating regions 68 substantially increases with increasing distance from the active area 6, while the widths 74 of the floating regions 68 remains substantially constant. Further, in certain embodiments, the SiC-SJ device 4 may include at least one additional JTE 12 in at least one buried epi layer 14 (e.g., SJ layer 18). That is, for example, while the illustrated embodiment includes a single JTE 12, it may be appreciated that in some embodiments, the SiC-SJ device 4 may include a respective JTE 12 (e.g., 12B, 12C, 12D, and so forth) in each epi layer 14. Alternatively, the SiC-SJ device 4 may include a JTE 12 for each of a set of epi layers 14, such that a JTE 12 is adjacent to every other epi layer 14, every third epi layer 14, and/or the like. Accordingly, in some embodiments, the floating regions 68 of each epi layer 14 may have different depths 72, widths 74, and spacing 76. For such embodiments, one or more masking/lithographic steps may be used to fabricate the JTE 12 of each epi layer 14.

Moreover, in some embodiments, the disclosed floating regions 68 may have one or more properties (e.g., doping, width, depth, spacing, etc.), as described for floating regions in the co-pending U.S. patent application Ser. No. 16/060, 549, entitled, "EDGE TERMINATION DESIGNS FOR SILICON CARBIDE SUPER-JUNCTION POWER DEVICES," filed Jun. 8, 2018, the disclosure of which is incorporated by reference herein in its entirety for all purposes. For example, in some embodiments, the widths 74 of each of the floating regions 68 may be between 0.8 microns ($\mu m$) and approximately 5 $\mu m$, while the spacing 76 between the floating regions 68 may generally be less than the thickness of the respective epi layer 14 the floating regions 68 are disposed within (e.g., the thickness 65Z of the device epi layer 14Z). Further, the depth 72 of each of the floating regions 68 may be approximately 1 μm. Moreover, the integrated charge (e.g., dose) of the JTE 12 may be between $6 \times 10^{12}$ cm$^{-2}$ and $3 \times 10^{13}$ cm$^{-2}$. For example, in some embodiments, the integrated charge of the JTE 12 may be $1.6 \times 10^{13}$ cm$^{-2}$.

The JTE 12 described herein provides an illustrative example of a junction termination, and more specifically, the JTE 12 described herein depicts an illustrative example of a graded zone JTE. However, in some embodiments, the implanted regions having the second conductivity type (e.g., p-type), such as the floating regions 68, may additionally or alternatively be implemented to have one or more properties corresponding to another termination and/or junction termination structure. For instance, the implanted regions may be implemented as a single zone JTE, which may include a single implanted region in contact with the intermediate well region 66, and/or as a multiple zone JTE, which may include two or more connected implanted regions. In some embodiments, the two or more connected implanted regions may have the same or different properties, and at least one of the two or more connected implanted regions may contact the intermediate well region 66. Additionally, in some embodiments, the implanted regions may be implemented to form a multiple floating zone JTE. In such embodiments, a first implanted region may contact the intermediate well region 66, while a set of additional implanted regions, such as the floating regions 68, having different spacing and/or widths may be implanted disconnected from the first implanted region and from one another. Further, in some embodiments, the implanted regions (e.g., the floating regions 68) may be implemented to form a floating field ring (FFR) termination. In such embodiments, the floating regions 68 may be implanted disconnected from one another and disconnected from the intermediate well region 66. Additionally or alternatively, the implanted regions may be implemented to form a space modulated JTE, which may include a first implanted region in contact with the intermediate well region and disconnected from a set of additional implanted regions implanted to form a FFR. Accordingly, it may be appreciated that techniques described herein may be applied to any suitable junction termination, such as a single zone JTE, a multiple zone JTE, a graded JTE, a multiple floating zone JTE, a FFR, a space modulated JTE, and/or the like, and that embodiments described herein are intended to be illustrative and not limiting.

Figure 2:
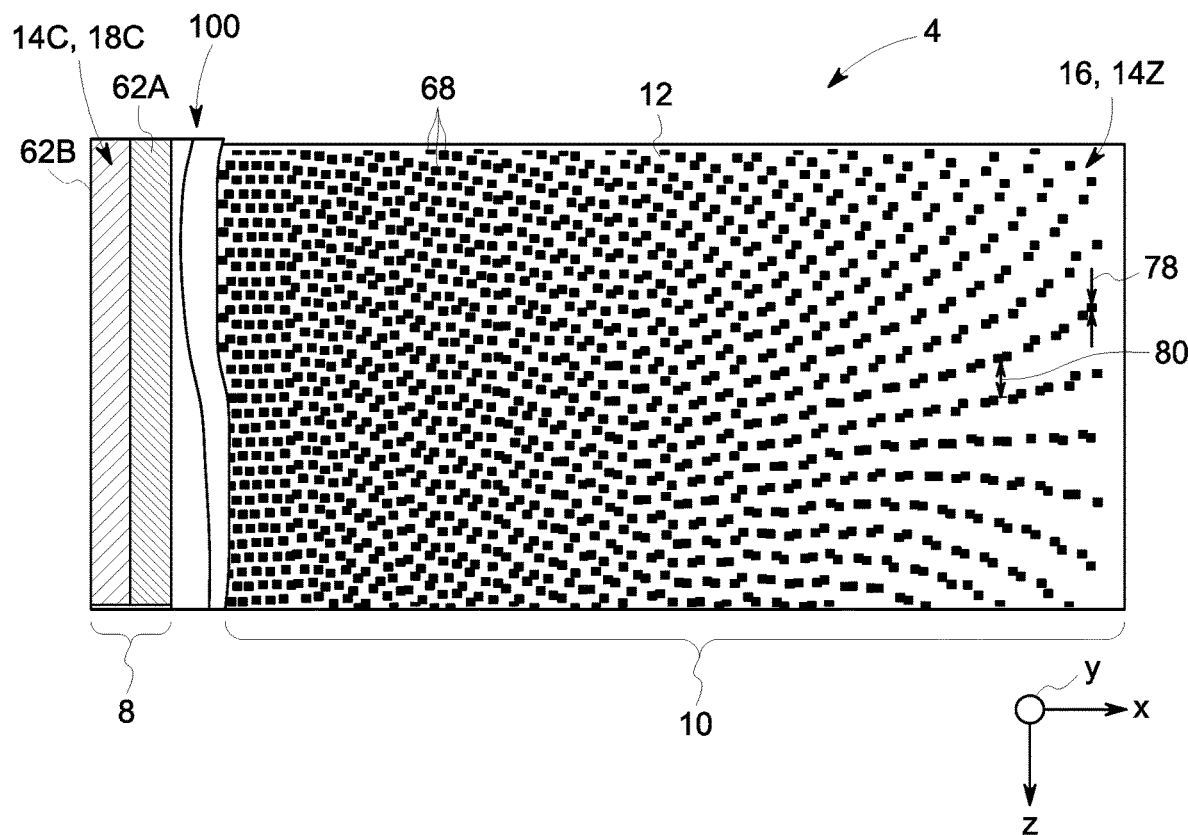
FIG. 2 is a top-down view of the SiC-SJ device of FIG. 1, in accordance with aspects of the present technique.

FIG. 2 illustrates a top-down view (perpendicular to the view of FIG. 1) of the SiC-SJ device 4, in accordance with embodiments of the present approach. More specifically, FIG. 2 illustrates a top-down view of an embodiment of a SiC-SJ device 4 having a termination area 10 that includes floating regions 68, implemented as disconnected blocks of doping. In particular, FIG. 2 illustrates top-down views of the JTE 12 and a cut-away 100 revealing the SJ layer 18C. In other words, the JTE 12 and the SJ layer 18C are illustrated in the same top-down view. However, it may be appreciated that the SJ layer 18C may be disposed at a different depth (e.g., along the Y-axis) compared to the JTE 12, as indicated by the cut-away.

For the embodiment illustrated in FIG. 2, each floating region 68 has a particular length 78, as well as additional spacing 80 along the Z-axis. In some embodiments, the length 78 of each floating region 68 may be between 0.8 μm and approximately 5 μm, while the additional spacing 80 between the floating regions 68 may generally be less than the thickness 65 of the respective epi layer 14 the floating regions 68 are disposed within (e.g., the thickness 65Z of the device epi layer 14Z). While the floating regions 68 are illustrated as disconnected blocks, the floating regions 68 may be implemented as disconnected blocks, continuous pillars, stripes, segments, grids, dots, or any other suitable shape. Accordingly, the length 78 and additional spacing 80 between floating regions 68 may vary between certain embodiments. Moreover, as described above, the floating regions 68 may be implemented with properties (e.g., length 78, additional spacing 80, and/or the like) to form an alternative termination and/or junction termination structure. As such, embodiments disclosed herein are intended to be illustrative and not limiting.

In some embodiments, shaping the electric fields of the SiC-SJ device 4 may involve forming the JTE 12 such that avalanche breakdown, a result of impact-ionization, occurs outside of the termination area 10 (e.g., within the active area 6 and/or the intermediate area 8) at nominally rated voltages. That is, for example, in certain embodiments, avalanche breakdown may be isolated to the active area 6 and/or the intermediate area 8, which may maximize the breakdown voltage of the SiC-SJ device 4, enabling a breakdown voltage that is close to or at device entitlement. Returning briefly to FIG. 1, it may be appreciated that in a conventional SiC device (e.g., a SiC device having an epi doping concentration of $5.0 \times 10^{15}$ cm$^{-3}$ or more in the termination regions 24), in order to contain the avalanche breakdown within the active area 6 and/or the intermediate area 8, the width 11 of the JTE 12 may be greater than or equal to five times (5×) the one dimensional (1-D) depletion width of the device, where the 1-D depletion width may be approximated as the epi thickness of the active area 6 (e.g., the sum of the thicknesses 65 of the epi layers 14). That is, for example, the ratio of the width 11 of the JTE 12 to the 1-D depletion width of the device may be 5:1 in a conventional device. However, as shown in the graph 120 illustrated in FIG. 3, to reach a peak (e.g., maximum) breakdown voltage in a SiC-SJ device 4 having one or more SJ layers 18 and having termination regions 24 with a minimized epi doping concentration, the ratio of the width 11 of the JTE 12 to the 1-D depletion width of the SiC-SJ device 4 may be substantially reduced. For example, as described in greater detail below, the graph 120 shows that the avalanche breakdown may be contained within the active area 6 and/or the intermediate area 8 for SiC-SJ device designs having a JTE 12 with a width 11 greater than or equal to 2.75× (e.g., between 2.75× and 5×, between 2.75× and 4×, between 2.75× and 3×) the one 1-D depletion width of the SiC-SJ device 4. As such, by using the disclosed JTE design, it is presently recognized that the ratio of the active area 6 of the SiC-SJ device 4 to the overhead area (e.g., including the termination area 10) may be increased for the SiC-SJ device 4. Accordingly, the die area available for the active area 6 may be increased. It may be noted, as discussed below, that in certain embodiments, it may be desirable for breakdown to occur at the JTE 12 in the termination area 10 of the SiC-SJ device 4. For such embodiments, the disclosed junction termination designs can also enable a breakdown voltage that is close to or at device entitlement with a reduced termination width 11.

More specifically, the graph 120 plots an example of a breakdown voltage achievable by a SiC-SJ device 4 as a function of the width 11 of the JTE 12 (e.g., width of the termination area 10). For the illustrated example of the SiC-SJ device 4 in FIG. 3, the 1-D depletion width is 40 μm. Accordingly, the ratio for the width 11 of the JTE 12 (e.g., width of the termination area 10) to the 1-D depletion width of the SiC-SJ device 4 may be determined by dividing the width 11 by 40 μm. However, it may be appreciated that the ratios of the width 11 of the JTE 12 (e.g., width of the termination area 10) to the 1-D depletion width of the SiC-SJ device 4 described herein may be extended to SiC-SJ device designs having any suitable 1-D depletion width. Thus, embodiments described herein are intended to be illustrative and not limiting.

Figure 4:
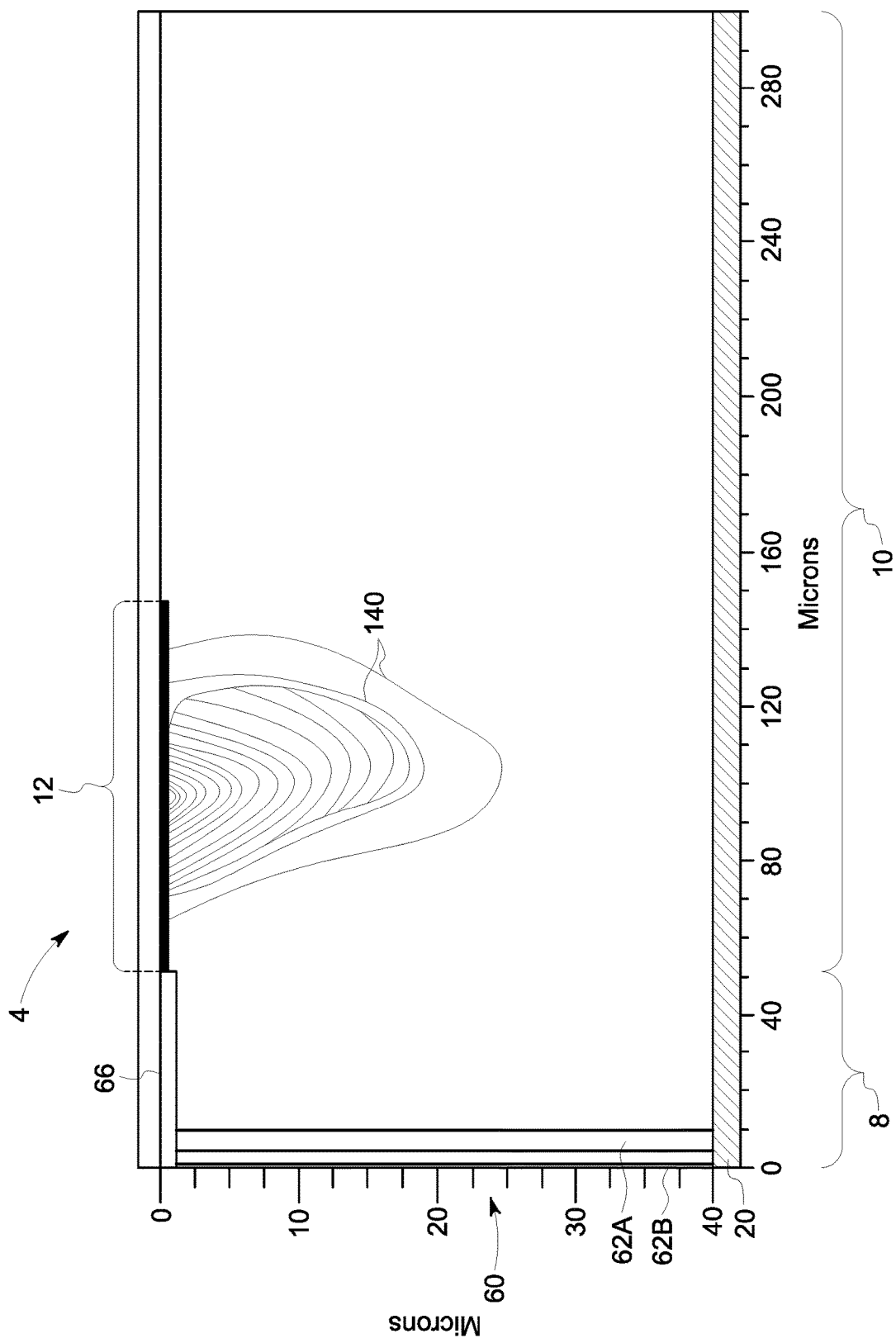
FIG. 4 is a schematic illustrating an embodiment of the SiC-SJ device of FIG. 1 having a termination area with a first width, including equal rate lines demonstrating the impact ionization rate present under reverse bias conditions, in accordance with aspects of the present technique.

To the left of the line 122 (e.g., for a ratio of the width 11 of the JTE 12 to the 1-D depletion width of the device below about 2.75), the avalanche breakdown occurs at the JTE 12 (e.g., the termination area 10) and/or at the intersection of the JTE 12 and the intermediate well region 66. To help illustrate, a cross-sectional view of a portion of an embodiment of a SiC-SJ device 4 having a JTE 12 with a width 11 of 100 μm (e.g., with a ratio of the width 11 of the JTE 12 to the 1-D depletion width of the device of about 2.5) is shown in FIG. 4. Additionally, FIG. 4 includes equal rate lines 140 that indicate an impact generation rate (e.g., impact ionization rate) present in different regions of the SiC-SJ device 4 under reverse bias conditions. It may be noted that the impact generation rate is represented as being higher (e.g., greater) when the equal rate lines 140 are close to one another and lower when there is larger spacing between the equal rate lines 140. Accordingly, because the avalanche breakdown occurs at the JTE 12 (e.g., the termination area 10), the impact generation rates are highest at the JTE 12 and the termination area 10 and decrease outward from these regions.

Figure 3:
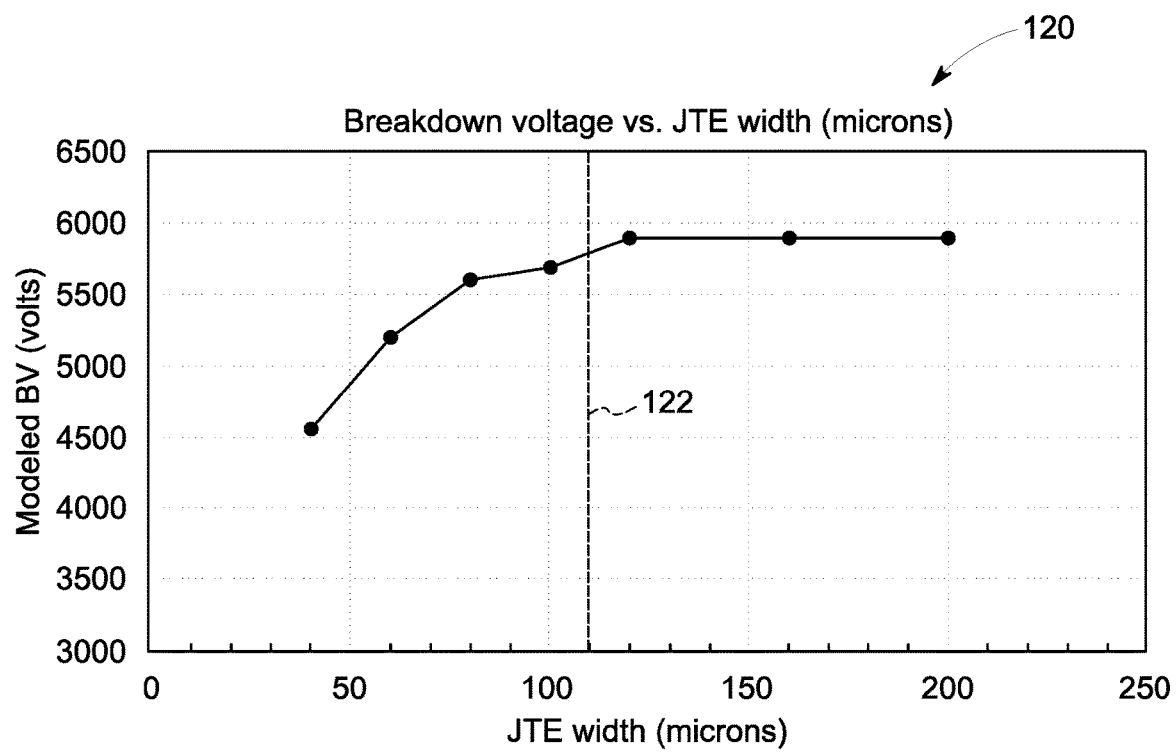
FIG. 3 is a graph that plots an achievable breakdown voltage as a function of a junction termination extension (JTE) width for an example embodiment of the SiC-SJ device of FIG. 1, in accordance with aspects of the present technique.
Figure 5:
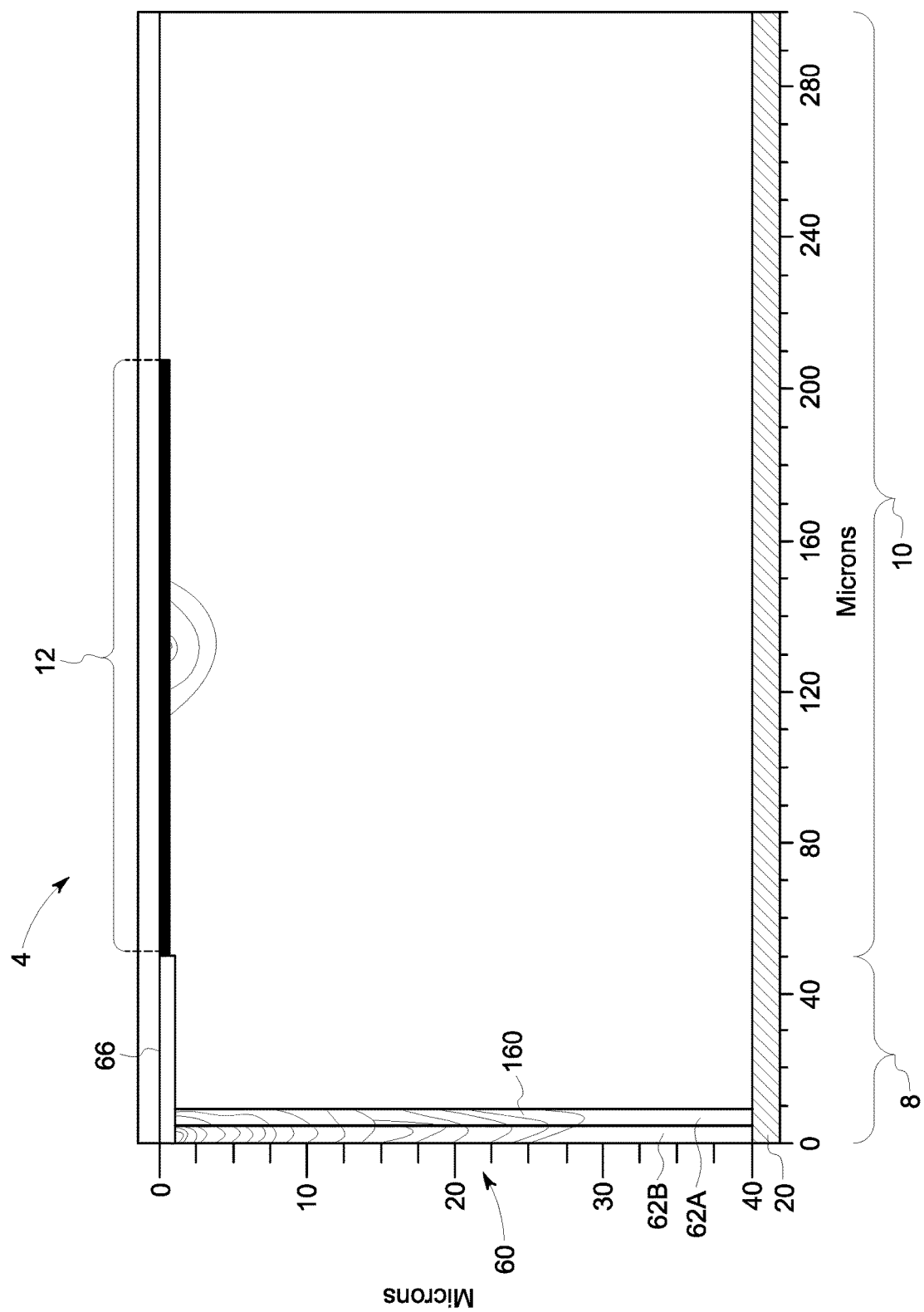
FIG. 5 is a schematic illustrating another embodiment of the SiC-SJ device of FIG. 1 having a termination area with a second width, including equal rate lines demonstrating the impact ionization rate present under reverse bias conditions, in accordance with aspects of the present technique.

Turning briefly back to FIG. 3, to the right of the line 122 (e.g., for a ratio of the width 11 of the JTE 12 to the 1-D depletion width of the device greater than or equal to about 2.75), the avalanche breakdown desirably occurs at the active area 6 and/or the intermediate area 8, rather than in the termination area 10 of the SiC-SJ device 4. To help illustrate, a cross-sectional view of a portion of an embodiment of a SiC-SJ device 4 having a JTE 12 with a width 11 of 160 μm (e.g., with a ratio of the width 11 of the JTE 12 to the 1-D depletion width of the device of about 4) is shown in FIG. 5. For comparison, all other device parameters (e.g., minimized epi doping, thickness 65, and/or the like) included in the embodiment illustrated in FIG. 4 are held constant in the embodiment illustrated in FIG. 5. Additionally, FIG. 5 includes equal rate lines 160 that indicate an impact generation rate (e.g., impact ionization rate) present in different regions of the SiC-SJ device 4 under reverse bias conditions. It may be noted that the impact generation rate is represented as being higher (e.g., greater) when the equal rate lines 160 are close to one another and lower when there is larger spacing between the rate lines 140. Accordingly, because the avalanche breakdown occurs at the active area 6 and/or the intermediate area 8, the impact generation rates are highest at the SJ region 60 and the well region 66 in the intermediate area 8 and decrease outward from these regions. As such, for the illustrated embodiment, the impact generation rates within the termination area 10 are minimized and may gradually decrease with increasing distance from the intermediate area 8 and/or the active area 6. Accordingly, embodiments of the SiC-SJ device 4 having a ratio of the width 11 of the JTE 12 to the 1-D depletion width of the device greater than or equal to about 2.75 may achieve the maximum breakdown voltage of the SiC-SJ device 4.

Figure 6:
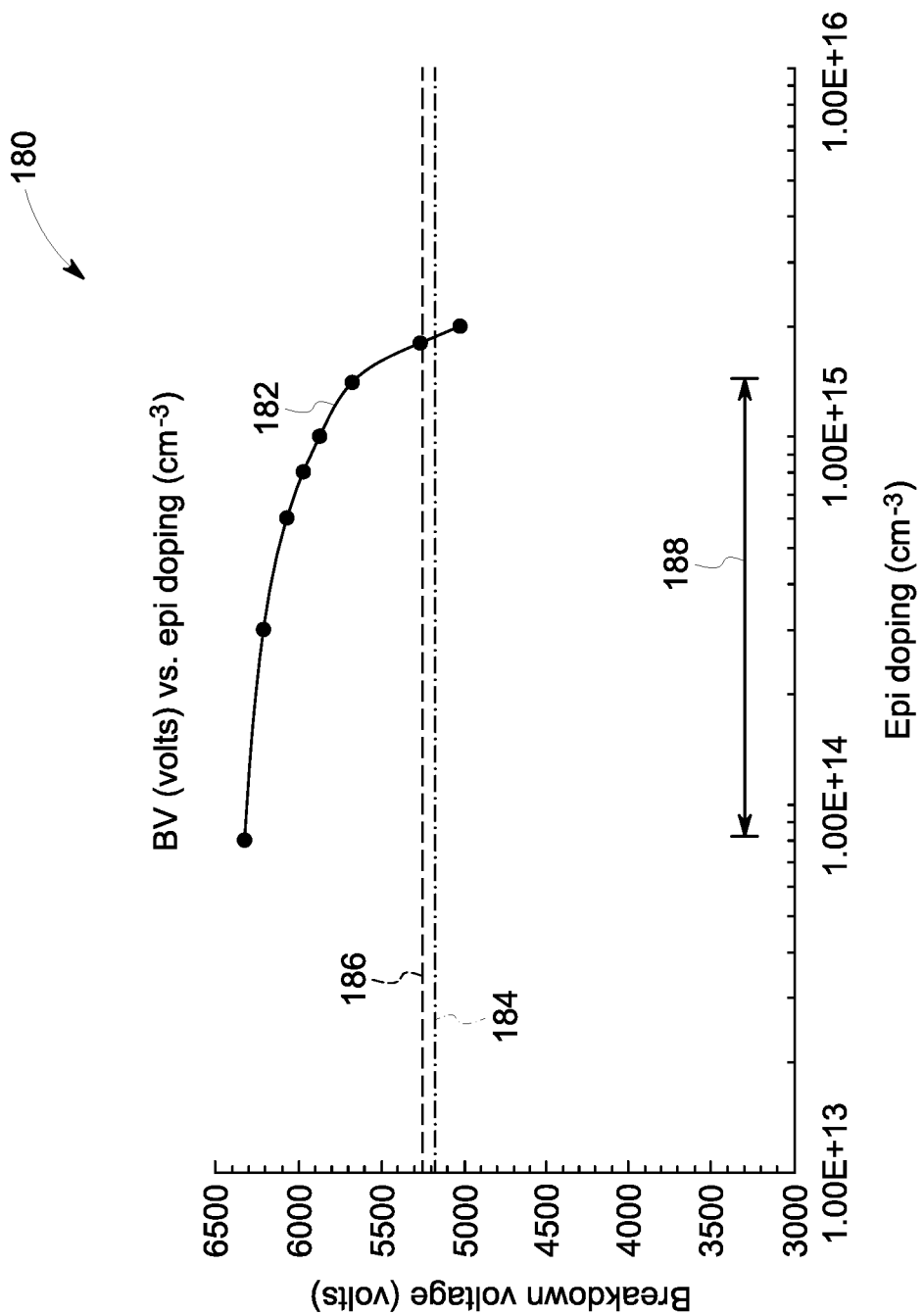
FIG. 6 is a graph illustrating breakdown voltage as a function of epi doping concentration per cubic centimeter ($cm^{-3}$) of the termination area for an example embodiment of the SiC-SJ device of FIG. 1, in accordance with aspects of the present technique.

As set forth above, the termination regions 24 (e.g., 24A, 24Z) generally have a minimized epi doping concentration that is substantially lower than the doping concentration of the first conductivity type in the first set of SJ pillars 62A and/or the second set of SJ pillars 62B of the device. In some embodiments, along with the width of the JTE 12, the minimized epi doping concentration of the termination regions 24 may influence the maximum breakdown voltage of the SiC-SJ devices 4 and/or the location of avalanche breakdown within the SiC-SJ devices 4. To demonstrate this relationship, the graph 180 shown in FIG. 6, illustrates an example of a breakdown voltage of SiC-SJ devices 4 as a function of epi doping concentration ($cm^{-3}$) in the termination regions 24.

A curve 182 on the graph 180 plots breakdown voltage of an embodiment of the SiC-SJ device 4 of FIG. 1 as a function of epi doping concentration in the termination regions 24. More specifically, the curve 182 illustrates an example of the relationship between the breakdown voltage of a SiC-SJ device 4 having a single device JTE 12 and the epi doping concentration of the termination regions 24. The graph 180 additionally includes a first line 184, which indicates the threshold breakdown voltage that qualifies a device to receive a 4.5 kilovolt (kV) device rating. Further, the graph 180 includes a second line 186, which denotes a breakdown voltage level below which the avalanche breakdown of the SiC-SJ device 4 is occurring outside the termination area 10 (e.g., the avalanche breakdown occurs within the active area 6 and/or the intermediate area 8).

Accordingly, as illustrated by the graph 180, to design a SiC-SJ device 4 of a certain device rating (e.g., 4.5 kV) and to contain the avalanche breakdown within the active area 6 and/or the intermediate area 8 (e.g., to increase the maximum breakdown voltage of the device), the termination regions 24 may be implemented with an epi doping concentration less than or equal to $1.5 \times 10^{15}$ $cm^{-3}$ (e.g., $8.0 \times 10^{13}$ $cm^{-3}$, $1.0 \times 10^{15}$ $cm^{-3}$), which is referred to herein as the minimized epi doping concentration 188 for this example SiC-SJ device 4. For example, for an epi doping concentration less than or equal to $1.5 \times 10^{15}$ $cm^{-3}$, the avalanche breakdown of the SiC-SJ device 4 occurs in the active area 6 and/or the intermediate area 8 (e.g., at the SJ region 60). On the other hand, for an epi doping concentration greater than $1.5 \times 10^{15}$ $cm^{-3}$, the avalanche breakdown occurs at the termination area 10 (e.g., the device JTE 12) and/or at the intersection of at the intersection of the device JTE 12 and the intermediate well region 66. As a result, for epi doping concentrations greater than $1.5 \times 10^{15}$ $cm^{-3}$ (e.g., the minimized epi doping concentration 188 for this embodiment), the maximum breakdown voltage of the SiC-SJ device 4 decreases as the epi doping concentration of the termination regions 24 increases. Moreover, in some cases, the maximum breakdown voltage of the SiC-SJ device 4 may decrease below the threshold breakdown voltage (e.g., the first line 184) used to classify the voltage rating of the SiC-SJ device 4. Further, while the minimized epi doping concentration 188 described herein is associated with embodiments of the SiC-SJ device 4 having a single JTE 12, it is presently recognized that the range of the minimized epi doping concentration 188 for termination regions 24 may have greater tolerance to increases in epi doping concentrations for device designs with a greater number of JTEs 12. Accordingly, embodiments described herein are intended to be illustrative and not limiting.

Figure 7:
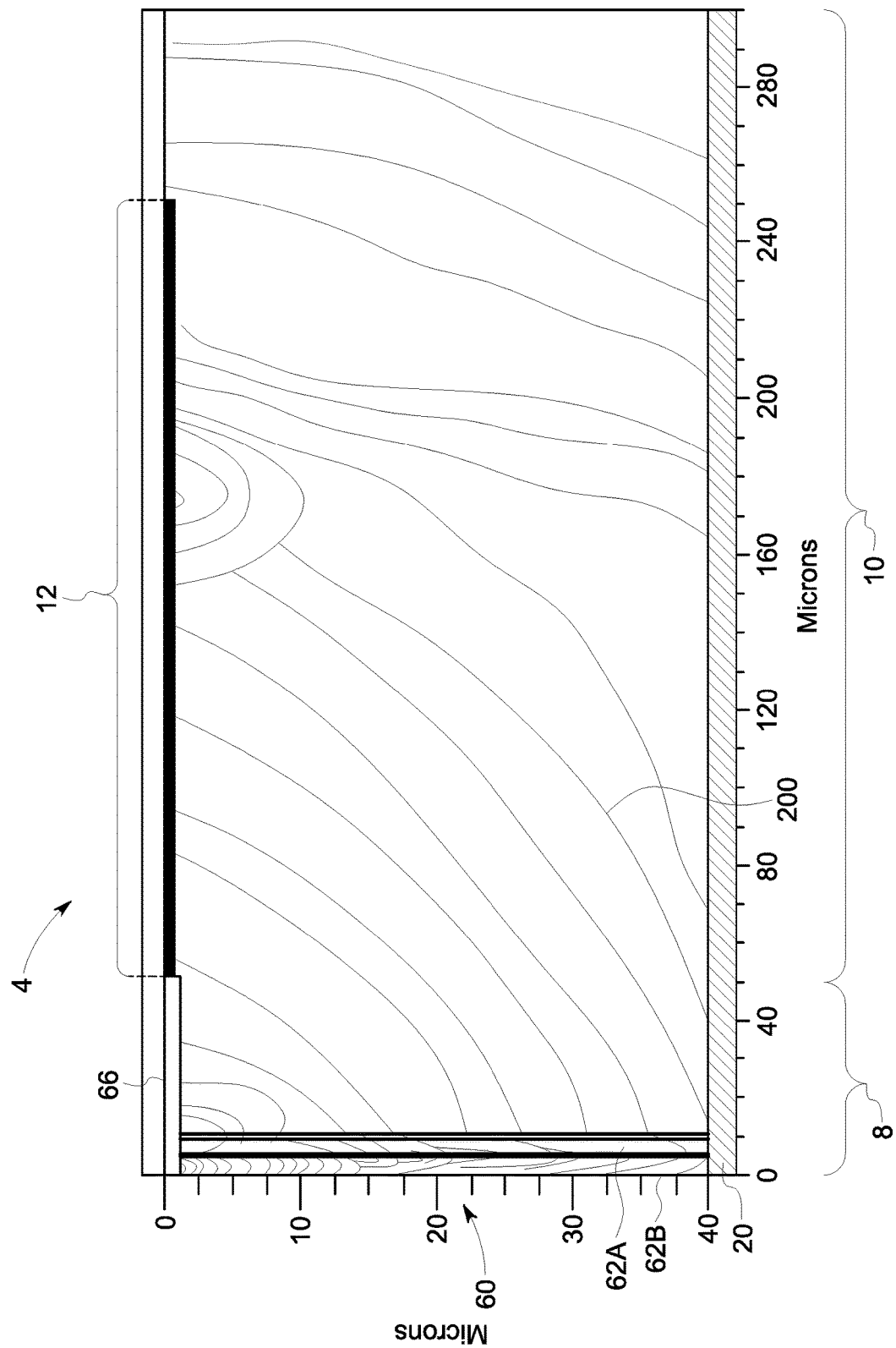
FIG. 7 is a schematic illustrating a cross-sectional view of an embodiment of the SiC-SJ device of FIG. 1 having a termination area with a first epi doping concentration, including equal rate lines demonstrating the impact ionization rate present under reverse bias conditions, in accordance with aspects of the present technique.
Figure 8:
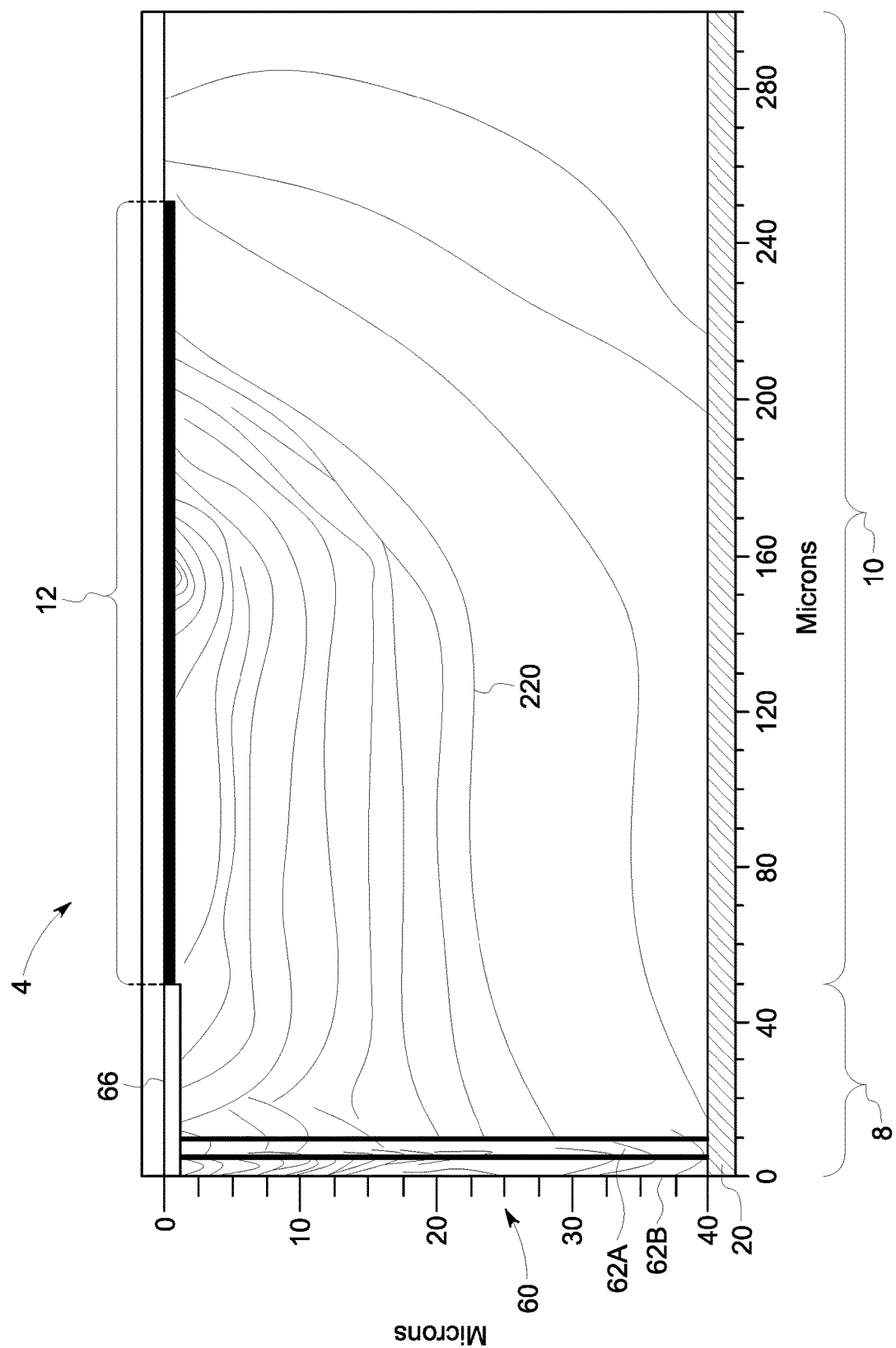
FIG. 8 is a schematic illustrating a cross-sectional view of another embodiment of the SiC-SJ device of FIG. 1 having a termination area with a second epi doping concentration, including equal rate lines demonstrating the impact ionization rate present under reverse bias conditions, in accordance with aspects of the present technique.

To help illustrate the influence the epi doping concentration of the termination regions 24 has on the maximum breakdown voltage of the SiC-SJ devices 4 and/or the location of avalanche breakdown within the SiC-SJ devices 4, FIGS. 7 and 8 each illustrate a cross-sectional view of a portion of a respective embodiment of a SiC-SJ device 4 having a different respective epi doping concentration of the termination regions 24. For the portion of the embodiment of the SiC-SJ device 4 illustrated in FIG. 7, the epi doping concentration of the termination regions 24 is $8.0 \times 10^{13}$ cm$^{-3}$. Additionally, FIG. 7 includes equal rate lines 200 that indicate an impact generation rate (e.g., impact ionization rate) present in different regions of the SiC-SJ device 4 under reverse bias conditions. It may be noted that the impact generation rate is represented as being higher (e.g., greater) when the equal rate lines 200 are close to one another and lower when there is larger spacing between the equal rate lines 200. Accordingly, because the avalanche breakdown occurs at the active area 6 and/or the intermediate area 8 (e.g., the SJ region 60), the impact generation rates are highest at the active area 6 and/or the intermediate area 8 and decrease outward from these regions. Moreover, for the embodiment in which the avalanche breakdown occurs at the active area 6 and/or the intermediate area 8, the maximum breakdown voltage of the represented SiC-SJ device 4 is about 6300 kV.

For comparison, the portion of the embodiment of the SiC-SJ device 4 illustrated in FIG. 8, the epi doping concentration of the termination regions 24 is $1.4 \times 10^{15}$ cm$^{-3}$, while all other device parameters (e.g., width 11, thickness 65, and/or the like) included in the embodiment illustrated in FIG. 7 are held constant. Additionally, FIG. 8 includes equal rate lines 220 that indicate an impact generation rate (e.g., impact ionization rate) present in different regions of the SiC-SJ device 4 under reverse bias conditions. It may be noted that the impact generation rate is represented as being higher (e.g., greater) when the rate lines 220 are close to one another and lower when there is larger spacing between the rate lines 220. Since the avalanche breakdown of the illustrated embodiment occurs predominately at the active area 6 and/or the intermediate area 8 (e.g., the SJ region 60), the impact generation rates at the JTE 12 are higher than the impact generation rates at the JTE 12 illustrated in FIG. 7. As a result, the maximum breakdown voltage of the embodiment of the portion of the SiC-SJ device 4 illustrated in FIG. 8 is lower than the maximum breakdown voltage of the embodiment of the portion of the SiC-SJ device 4 illustrated in FIG. 7. That is, maximum breakdown voltage of the embodiment of the portion of the SiC-SJ device 4 illustrated in FIG. 8 is about 5600 kV. Thus, it may be appreciated that the maximum breakdown voltage of the SiC-SJ device 4 decreases as the epi doping concentration of the termination regions 24 increases.

Figure 9:
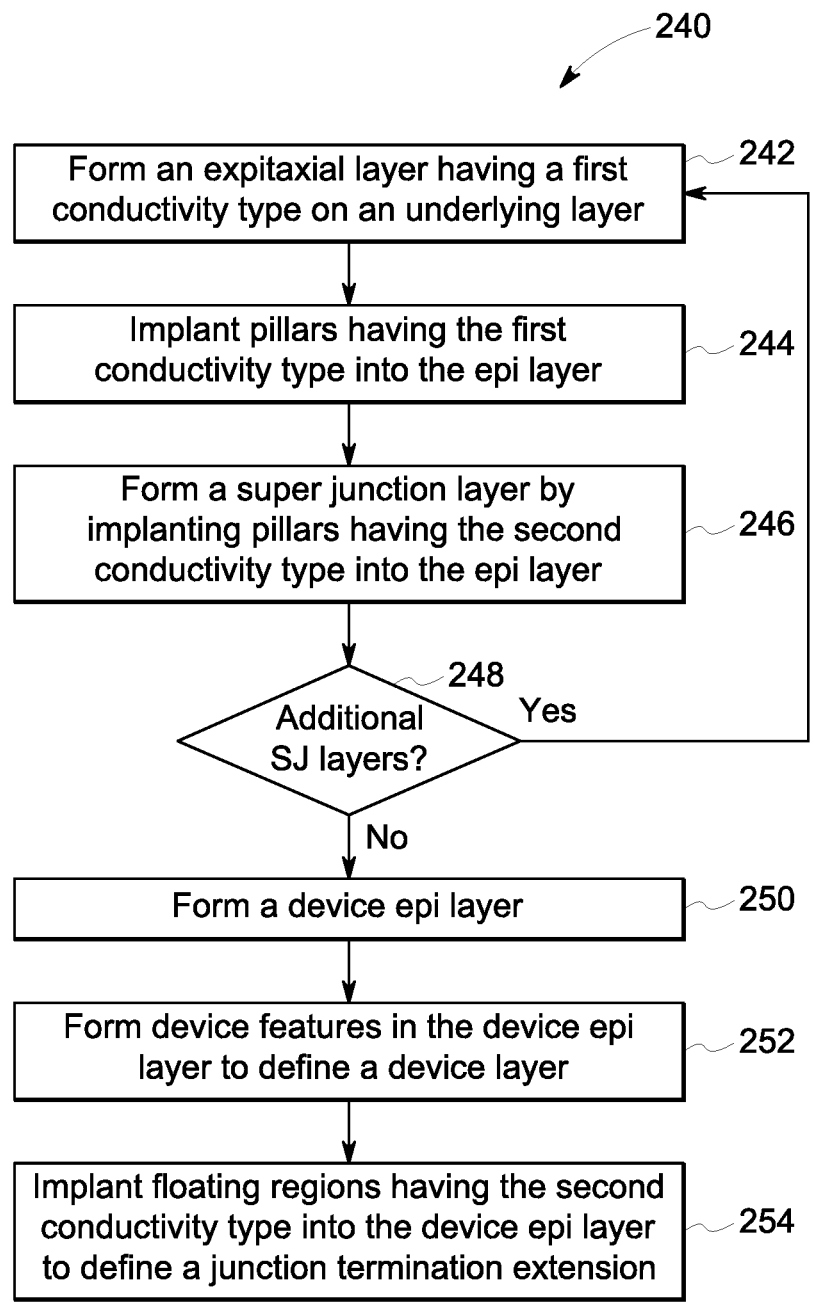
FIG. 9 is flow chart of a process for manufacturing an embodiment of a wide band gap SJ device having one or more junction terminations, in accordance with aspects of the present technique.

FIG. 9 is a flow chart of a process 240 for manufacturing an embodiment of the SiC-SJ device 4 having one or more junction terminations, such as one or more JTEs 12, in accordance with embodiments described herein. Although the following description of the process 240 is described in a particular order, which represents a particular embodiment, it should be noted that the process 240 may be performed in any suitable order. Further, certain steps may be repeated or skipped altogether, and additional steps may be included in the process 240 in other embodiments. The following description of the process 240 is described with reference to embodiments of the SiC-SJ device 4 illustrated in FIG. 1 and with reference to FIGS. 10-12.

Figure 10:
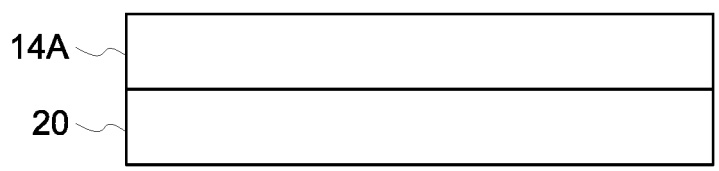
FIG. 10 is a cross-sectional view an embodiment of an intermediate structure formed during the fabrication of the SiC-SJ device of FIG. 1, where the intermediate structure has a first epitaxial (epi) layer formed on a substrate layer, in accordance with aspects of the present technique.

The illustrated process begins with forming (process block 242) an epi layer having a minimized epi doping concentration of first conductivity type on an underlying layer, as illustrated in FIG. 10. In some embodiments, the underlying layer may include the semiconductor substrate layer 20. As described above, the substrate layer 20 may be made of silicon, silicon carbide (SiC), gallium nitride, diamond, aluminum nitride, boron nitride, or any other suitable wide band gap substrate. Alternatively, the epi layer may be formed on another epi layer 14 and/or a SJ layer 18, as described in greater detail below.

To form the first epi layer 14A on the underlying layer, the epi layer 14A may be grown using chemical vapor deposition (CVD). However, in some embodiments, the epi layer 14A may be grown onto the underlying layer using any suitable technique. The epi layer 14A may be formed from one or more wide band gap semiconductor materials, such as silicon carbide, gallium nitride, diamond, aluminum nitride, and/or boron nitride. Further, as discussed above, the epi layer 14A may have a first conductivity type (e.g., n-type) and a low dopant concentration relative to other regions of the SiC-SJ device 4 (e.g., the SJ pillars 62, the JTE 12, and/or the like). More specifically, in some embodiments, the first epi layer 14A may be formed without any intentional epi doping, such that the first epi layer 14A is formed with a minimized epi doping concentration that is less than or equal to $1.5 \times 10^{15}$ cm$^{-3}$, such as between $8.0 \times 10^{13}$ cm$^{-3}$ and $1.0 \times 10^{15}$ cm$^{-3}$.

Figure 11:
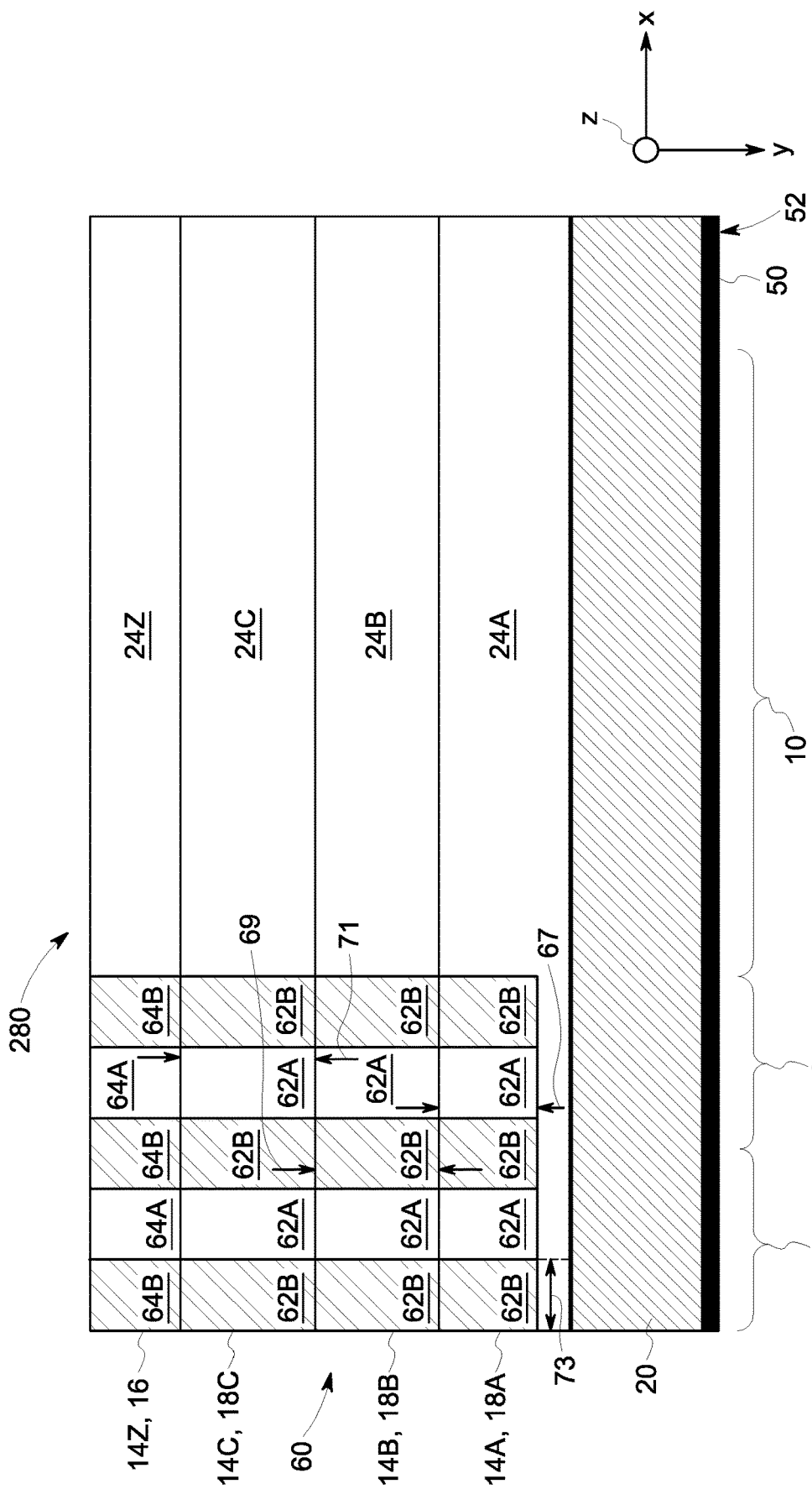
FIG. 11 is a cross-sectional view of the embodiment of the intermediate structure of FIG. 10 after forming a number of SJ layers and a device layer, in accordance with aspects of the present technique.

Turning back to FIG. 9, after the first epi layer 14A is formed on the underlying layer, the illustrated process proceeds with implanting (process block 244) pillars of a first conductivity type into the first epi layer 14A. More specifically, to form the SJ layer 18A, the first set of SJ pillars 62A having the first conductivity type may be implanted into the active area 6 and the intermediate area 8 within the first epi layer 14A. Moreover, as illustrated in FIG. 11, the implanted regions of the first conductivity type (e.g., n-type) may extend through the thickness 65A of the first epi layer 14A. Accordingly, in some embodiments, the regions of the first conductivity type may be implanted using a suitable high energy ion implantation technique. As such, each of the one or more regions may be implanted to a depth greater than 1 μm (e.g., to depths of 2 μm to 15 μm) within the epi layer 14A. Moreover, an implantation energy greater than 500 keV and/or less than 50 MeV may be used to implant each of the one or more regions. As such, a high energy implantation mask (e.g., silicon on insulator (SOI), polysilicon, thick silicon oxide, high-Z metals such as platinum, molybdenum, gold) may be used in conjunction with the high energy ion implantation. Moreover, the mask may be formed using any suitable means. That is, for example, the mask may be deposited, grown, and/or coated directly onto the portion of the epi layer 14A. Furthermore, once the mask material has been deposited on the surface of the epi layer 14A, the mask may be formed by patterning (e.g., lithographically patterning) the mask material to expose or uncover a portion of the epi layer 14A. The set of SJ pillars 62A may then be selectively implanted through the exposed portion of the epi layer 14A.

Additionally, to form the SJ layer 18A, the second set of SJ pillars 62B of the second conductivity type (e.g., p-type) is implanted (process block 246) into the active area 6 and/or the intermediate area 8. In some embodiments, the SJ layer 18A may be formed using a method of self-alignment and a set of masks, as described in the U.S. Provisional Patent Application No. 62/738,961, entitled, "SUPER-JUNCTION SEMICONDUCTOR DEVICE FABRICATION," filed Sep. 28, 2018, the disclosure of which is incorporated by reference herein in its entirety for all purposes. For example, after implanting the first set of SJ pillars 62A into a first portion of the epi layer 14A using a first mask, as described above, which covers a second portion of the epi layer, a second mask may be formed that is self-aligned relative to the first mask on the first portion of the epi layer 14A. In some embodiments, the second mask may be formed to have different physical and/or chemical properties relative to the first mask. For instance, the second mask may be formed from a different material, may undergo different chemical and/or physical alterations, and/or may be formed with different optical properties and/or wavelength absorption properties relative to the first mask. Accordingly, the first mask may then be removed by a suitable process (e.g., dissolved, stripped, and/or degraded) that leaves the second mask intact. By removing the first mask, the second portion of the epi layer 14A is exposed, while the first portion of the epi layer 14A remains masked by the second mask. Thus, the second set of SJ pillars 62B may be selectively implanted into the second portion of the epi layer 14A, and the second mask may then be removed. More specifically, in some embodiments, the second set of SJ pillars 62B may be implanted adjacent to and interleaved between the first set of SJ pillars 62A. For embodiment in which the first and second mask are self-aligned, misalignment (e.g., overlap and/or gaps) between the first set of SJ pillars 62A and the second set of SJ pillars 62B, which can disrupt the uniformity of the electrical field and reduce the maximum blocking voltage of the SiC-SJ device 4, may be reduced or avoided.

Further, the set of SJ pillars 62 may be implanted using any suitable means (e.g., high energy implant, lower energy implant), as discussed below. For instance, in some embodiments, the set of SJ pillars 62 may be implanted with standard low energy implantation techniques. For example, the set of SJ pillars 62 may be implanted to a depth less than or equal to 1 µm. Accordingly, an implantation energy less than 500 keV may be used to implant each of the SJ pillars 62. However, in some embodiments, the set of SJ pillars 62 may be implanted using a suitable high energy ion implantation technique. Accordingly, an implantation energy greater than 500 keV and/or less than 50 MeV may be used to implant each of the SJ pillars 62. Moreover, the masks described above may be a high energy implantation mask (e.g., silicon on insulator (SOI), polysilicon, thick silicon oxide, high-Z metals) used in conjunction with the high energy ion implantation.

To form a suitable number of SJ layers 18 in the SiC-SJ device 4, a portion of the process 240 (e.g., process block 242, process block 244, and/or process block 246) may be repeated one or more times. Accordingly, after the SJ layer 18A is formed, the process 240 may proceed with determining (decision block 248) whether an additional SJ layer 18B will be added to the SiC-SJ device 4. In embodiments having one or more additional SJ layers 18, for example, a second epi layer 14B may be formed (process block 242) on the previously implanted SJ layer 18A and a second SJ layer 18B may be formed (e.g., process block 244, process block 246). For example, for the embodiment of the SiC-SJ device intermediate 280 illustrated in FIG. 11, the portion of the process 240 (e.g., process block 242, process block 244, and/or process block 246) may also be repeated to form a third SJ layer 18C.

After completing fabrication of the one or more SJ layers 18, the process 240 illustrated in FIG. 9 proceeds with forming (process block 250) a device epi layer 14Z having the minimized epi doping concentration of the first conductivity type. As discussed with reference to the formation of the one or more epi layers 14 of the SJ layers 18 (process block 242), the device epi layer 14Z may be grown using CVD. Alternatively, the device epi layer 14Z may be formed on the one or more underlying SJ layers 18 using any suitable technique. The device epi layer 14Z may also be formed from one or more wide band gap semiconductor materials, such as silicon carbide, gallium nitride, diamond, aluminum nitride, and/or boron nitride. More specifically, for a SiC-SJ device 4 having a single junction termination (e.g., a single JTE 12), the device epi layer 14Z may be formed with a minimized epi doping concentration that is less than or equal to $1.5 \times 10^{15}$ cm$^{-3}$, such as between $8.0 \times 10^{13}$ cm$^{-3}$ and $1.0 \times 10^{15}$ cm$^{-3}$.

Figure 12:
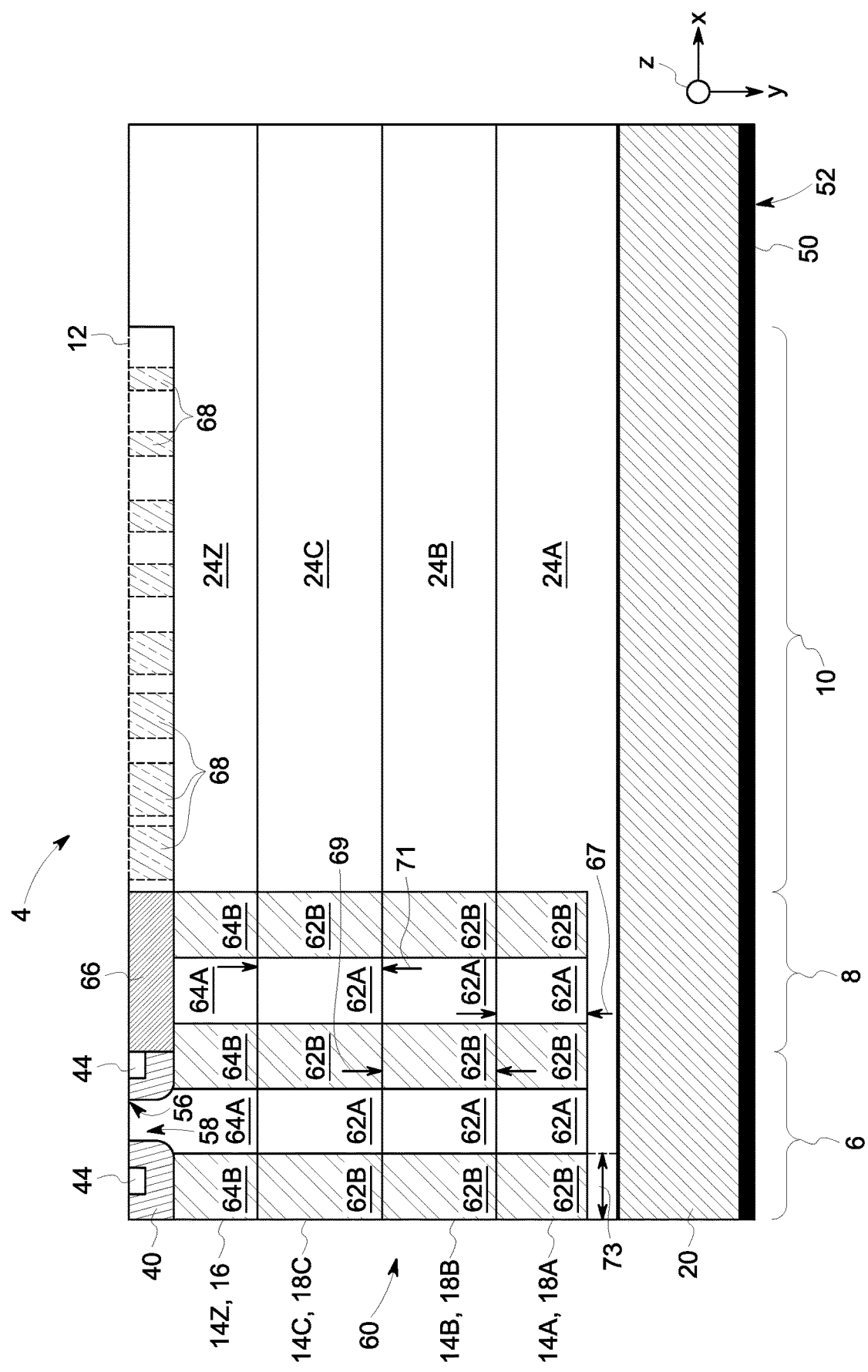
FIG. 12 a cross-sectional view of the embodiment of the intermediate structure of FIG. 11 after a junction termination extension (JTE) has been implanted in the termination region of the device layer, in accordance with aspects of the present technique.

The process 240 illustrated in FIG. 9 then proceeds with forming (process block 254) certain device features within the active area 6 and/or the intermediate area 8 within the device epi layer 14Z to define a device layer 16. That is, for example, the first set of device layer pillars 64A and second set of device layer pillars 64B may be implanted in the active area 6 and/or the intermediate area 8 within the device epi layer 14Z. More specifically, in some embodiments, each of the first set of device layer pillars 64A and the second set of device layer pillars 64B may be implanted using high energy ion implantation techniques such that the first set of device layer pillars 64A contacts and electrically couples to the first set of SJ pillars 62A, and such that the second set of device layer pillars 64B contacts and electrically couples to the second set of SJ pillars 62B, as illustrated in FIG. 11. Further, in some embodiments, the first set of device layer pillars 64A and the second set of device layer pillars 64B may be implanted using the method of self-alignment and the set of masks, as described above with reference to the set of SJ pillars 62. Moreover, as described below, the doping concentration of at least one of the first set of device layer pillars 64A may be less than the doping concentration of the second set of device layer pillars 64B. Further, the well region 40, the source region 44, the intermediate well region 66 and/or the like may be formed (e.g., implanted) in the active area 6 and/or the intermediate area 8 within the device epi layer 14Z to define the device layer 16, as illustrated in FIG. 12. Accordingly, while the process block 252 is described herein as a single step, it may be appreciated that forming the device features (e.g., the first set of device layer pillars 64A, the second set of device layer pillars 64B, the well region 40, the intermediate well region 66, the source region 44, and/or the like) may constitute multiple steps, such as a separate implantation step for each respective feature and/or multiple implantation steps for each feature.

Further, the process 240 illustrated in FIG. 9 involves implanting (process block 254) floating regions having the second conductivity type into the termination region 24Z of the device epi layer 14Z to define a junction termination, such as a JTE 12, in the device layer 16, as illustrated in FIG. 12. The floating regions 68 may be implanted according to any suitable means (e.g., high energy implant, lower energy implant). Accordingly, in some embodiments, the floating regions 68 may be selectively implanted through a portion of the termination region 24Z exposed by a mask formed on the termination region 24Z, and the mask may then be removed. Further, in certain embodiments, the floating regions 68 may be implanted to a depth less than or equal to 1 µm. Accordingly, an implantation energy less than 500 keV may be used to implant each of the floating regions 68. However, in some embodiments, the floating regions 68 may be implanted according to a suitable high energy ion implantation technique. Accordingly, for such embodiments, each of the floating regions 68 may be implanted to a depth greater than approximately 2 µm and/or less than approximately 15 µm within the device epi layer 14Z. Moreover, an implantation energy greater than 500 keV and/or less than 50 MeV may generally be used to implant each of the floating regions 68. Subsequently, other processing steps may be performed to form other features (e.g., gate electrode 48, dielectric layer 46, source contact 54, drain contact 50, and/or the like) of the SiC-SJ device 4 to form a functional power conversion device, in accordance with the present disclosure.

In certain embodiments, different implantation operations may be used to implant the features of the second conductivity type in the device epi layer 14Z, such as the well regions 40 and the floating regions 68. Alternatively, in some embodiments, the floating regions 68 may be implanted concurrently with other features of the device epi layer 14Z (e.g., well regions 40, intermediate well region 66). For instance, the floating regions 68 of the JTE 12 may be implanted with the same dopant type (e.g., a p-type or n-type dopant) and/or utilizing the same materials (e.g. Al, B, N, P, etc.) during the same ion implantation step used to implant these features having the second conductivity type, which may reduce fabrication time and cost.

Figure 13:
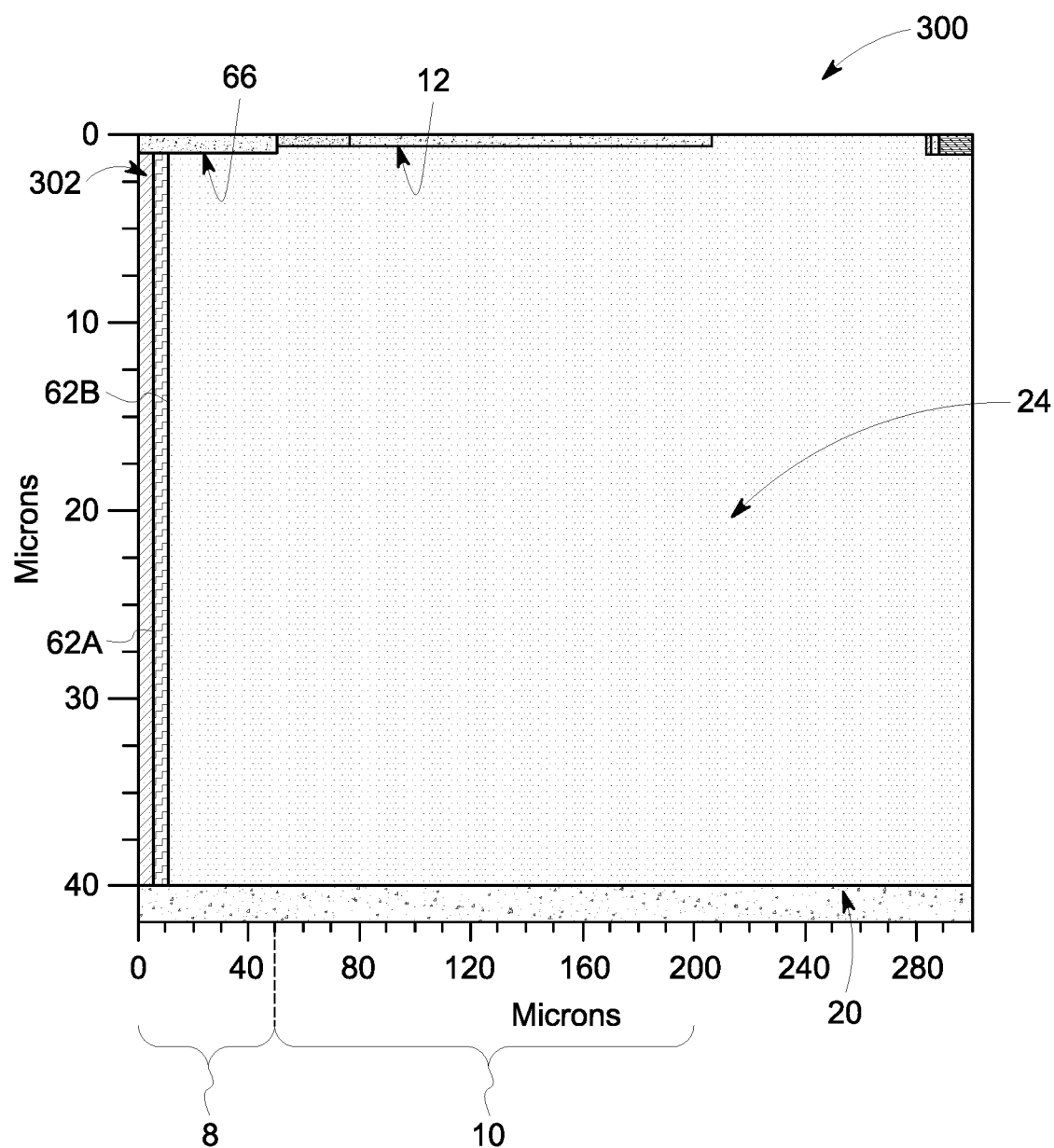
FIG. 13 is a cross-sectional view of a portion of an embodiment of a SiC-SJ device having a termination area that includes a JTE, in accordance with aspects of the present technique.

As mentioned, in certain embodiments, the doping of the SJ pillars 62A of the first conductivity type (e.g., n-type) nearest the termination area 10 may be modified, relative to the other SJ pillars 62A, to further tune the BV of the device, as well as control the portion of the device (e.g., active area 6 or termination area 10) that experiences breakdown when the BV is reached. To illustrate this, FIG. 13 is a cross-sectional view of a portion of an embodiment of a SiC-SJ device 300 having a termination area 10 that includes a JTE 12, in accordance with aspects of the present technique. For the illustrated embodiment of the SiC-SJ device 300, the first conductivity type is n-type, which corresponds to the conductivity type of SJ pillars 62A, the minimally epi doped epi layers 14 in the termination area 10, and the SiC substrate 20. Additionally, for the illustrated embodiment, the second conductivity type is p-type, which corresponds to the conductivity type of the SJ pillars 62B, the intermediate well region 66, and the JTE 12.

Figure 14:
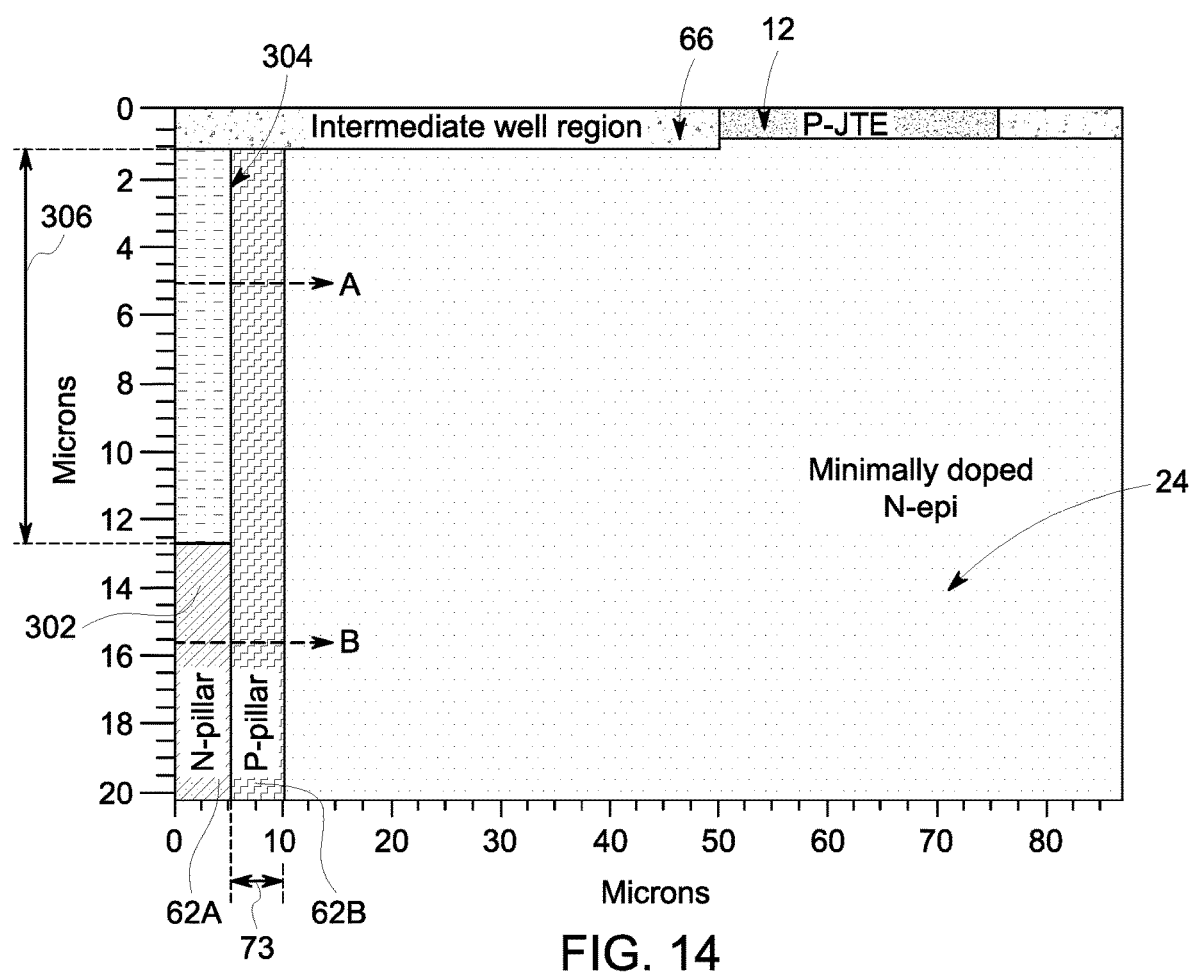
FIG. 14 is an enlarged view of the embodiment of the SiC-SJ device of FIG. 13, in accordance with aspects of the present technique.

The illustrated SiC-SJ device 300 was modeled to determine how varying the doping of the final SJ pillar 64A of the first conductivity type nearest the termination area 10 (hereinafter referred to as the modified SJ pillar 302) affects the breakdown properties of the device 300. With this in mind, FIG. 14 is an enlarged view of the embodiment of the SiC-SJ device 300 of FIG. 13. As illustrated, the modified SJ pillar 302 includes a modified portion 304 having a lower n-type doping concentration relative to the remainder of the pillar 302 and relative to the other n-type SJ pillars 62A in the active area 6 of the device 300 (not shown). The modified portion 304 of the SJ pillar 302 may be described as extending a depth 306 into one or more epi layers 14, below the intermediate well region 66. For example, in the illustrated embodiment, the depth 306 of the modified portion 304 is about 12 μm. As discussed below, by controlling both the depth 306 and the doping concentration within the modified portion 304 of the modified SJ pillar 302, the breakdown behavior of the device 300 can be controlled. It may be appreciated that, while FIGS. 13 and 14 only illustrate the intermediate area 8 and the termination area 10 of one portion of the device 300, the n-type SJ pillar 64A nearest the termination area 10 in other portions of the device 300 may also be modified SJ pillars 302, as discussed herein.

For the modeling discussed below, embodiments of the SiC-SJ device 300 have a minimum epi doping concentration of $1 \times 10^{15}$ cm$^{-3}$ and a combined or total epi layer thickness of 40 μm. The intermediate well region 66 has a depth of 1 μm and a doping concentration of $3 \times 10^{17}$ cm$^{-3}$. The JTE 12 has a p-type doping dose of $3 \times 10^{13}$ cm$^{-2}$ and a width of 160 μm (e.g., slightly greater than four times the 1-D depletion width). The p-type SJ pillars 62B of the device 300 have a width 73 of 5 μm and a doping concentration of $1.7 \times 10^{16}$ cm$^{-3}$. The n-type SJ pillars 62A have a width 73 of 5 μm, and, other than the modified portion 304 of the modified SJ pillar 302, have a doping concentration of $1.7 \times 10^{16}$ cm$^{-3}$. Additionally, it may be noted that, for these examples, the device layer pillars 64A and 64B are generally described as being part of the SJ pillars 62A and 62B, respectively.

Figure 15:
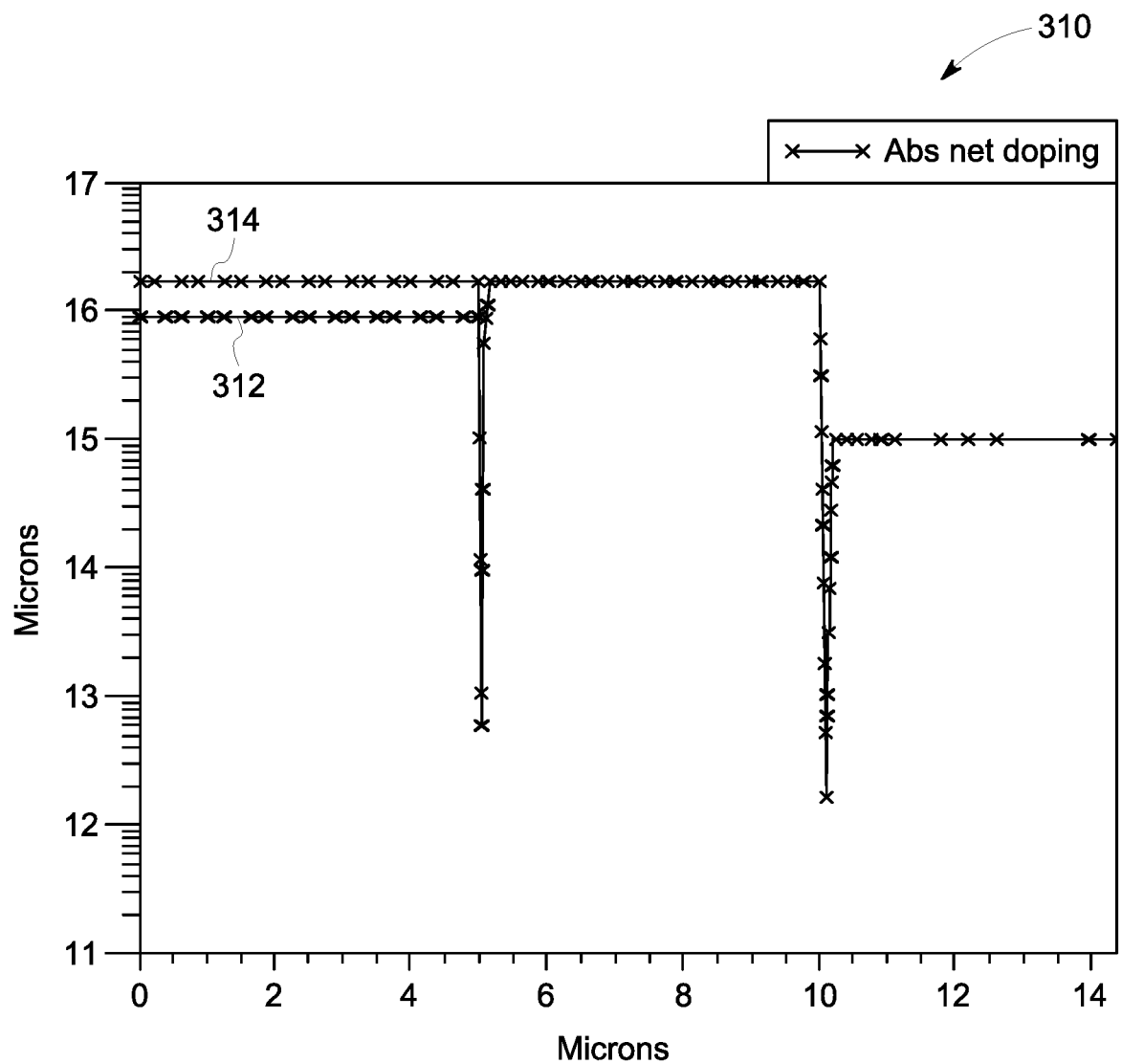
FIG. 15 is a graph illustrating absolute net doping concentrations as a function of distance along lines A and B of FIG. 14, in accordance with aspects of the present technique.

FIG. 15 is a graph 310 illustrating absolute net doping concentrations as a function of distance (μm) along lines A and B for the embodiment of the SiC-SJ device 300 illustrated in FIG. 14. More specifically, the curve 312 corresponds to line A, while the curve 314 corresponds to line B. As illustrated, when moving along line B, the net doping concentration within the unmodified portion of the modified SJ pillar 302 and within the p-type SJ pillar 64B are approximately the same, until the substantially lower minimal epi doing concentration is reached in the termination area 10. When moving along line A, the net doping concentration within the modified portion 304 of the modified SJ pillar 302 is substantially less (e.g., about 40% less) than that of the p-type SJ pillar 64B, until again the substantially lower minimal epi doing concentration is reached in the termination area 10.

Figure 16:
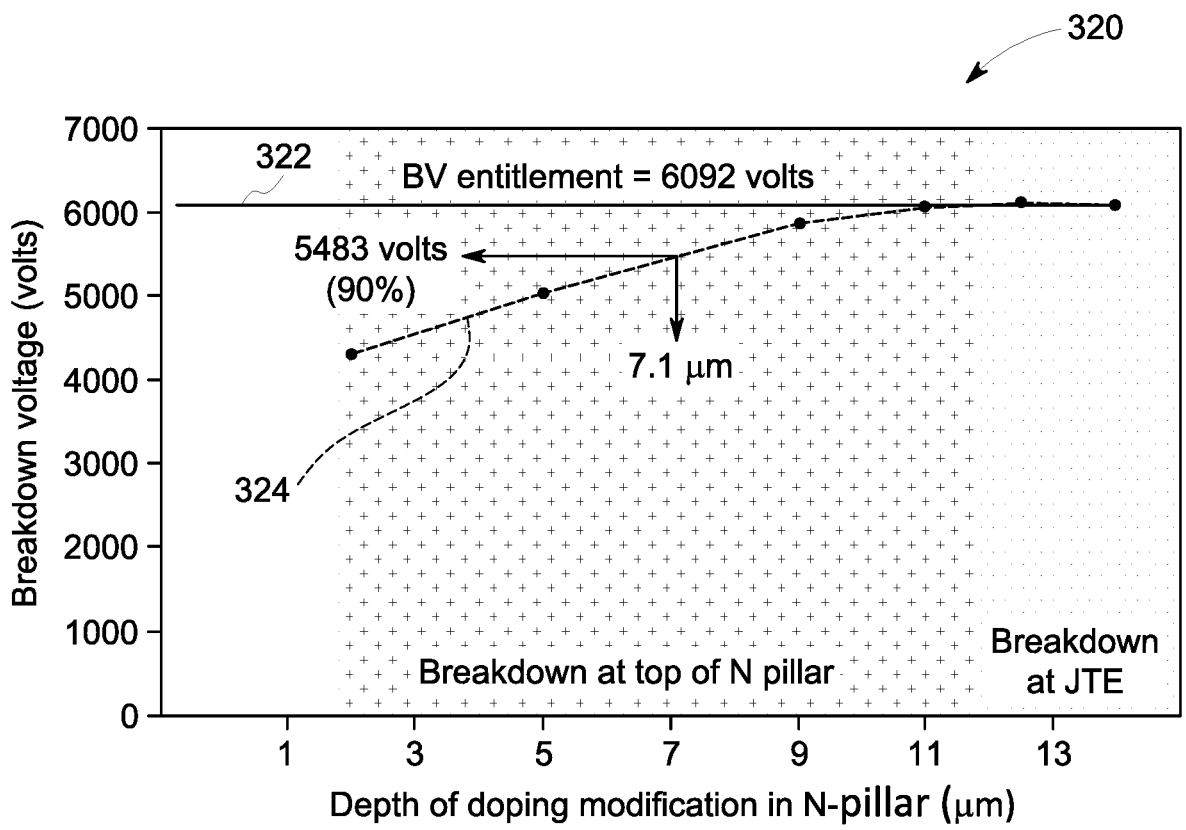
FIG. 16 is a graph illustrating breakdown voltage as a function of depth of a doping modification of a SJ pillar of the first conductivity type nearest the termination area, in accordance with aspects of the present technique.

FIG. 16 is a graph 320 illustrating breakdown voltage for embodiments of the SiC-SJ device as a function of the depth 306 of the modified portion 304 of the modified SJ pillar 302. In addition to the model parameters discussed above, the doping concentration of the modified portion 304 is $1.02 \times 10^{16}$ cm$^{-3}$ for embodiments represented in the graph 320. The graph 320 includes a line 322 that represents the BV entitlement of the SiC-SJ device 300, which is 6092 V for these examples. The graph 320 also includes a curve 324 representing the breakdown voltages of embodiments of the Si-SJ device 300 having different depths 306 of the modified portion 304 of the modified SJ pillar 302, which corresponds with the data of Table 1.

TABLE 1

Data corresponding to curve 324 of FIG. 16.

| Depth of modified portion of modified SJ pillar (μm) | % of total SJ pillar depth | BV (volts) |
| --- | --- | --- |
| 2 | 5.1% | 4330 |
| 5 | 12.8% | 5043 |
| 9 | 23.1% | 5876 |
| 11 | 28.2% | 6033 |
| 12.5 | 32.1% | 6092 |
| 14 | 35.9% | 6092 |

As illustrated by the graph 320, for the modeled embodiments of the SiC-SJ device 300, the breakdown voltage approaches device entitlement when the modified portion 304 of the modified SJ pillar 302 has a depth 306 of about 11 μm or more. In certain embodiments, this depth 306 may correspond to about 30% or more (e.g., approximately ⅓) of the total depth of the modified SJ pillar 302. As such, an embodiment of a SiC-SJ device 300 may be fabricated based on the modeled parameters set forth above, and the depth 306 of the modified portion 304 may be approximately 7.1 μm, which yields a breakdown voltage of about 5483 V, or about 90% of device entitlement. As also illustrated by the graph 320, for the modeled SiC-SJ device 300, when the modified portion 304 of the modified SJ pillar 302 has a depth 306 less than about 12 μm, then breakdown occurs at the top of the n-type SJ pillars 62A in the active area 6 and intermediate area 8 of the device 300, and when the modified portion 304 has a depth 306 greater than about 12 µm, then breakdown occurs at the JTE 12 in the termination area 10 of the device 300.

It is also presently recognized that it may be advantageous in certain embodiments for the depth 306 of the modified portion 304 of the modified SJ pillar 302 to correspond to the thickness of the device epi layer 14Z. For example, turning briefly back to FIG. 13, in an embodiment in which the device epi layer 14Z has a thickness 65Z of about 14 µm, and the intermediate well region 66 occupies about the top 1 µm of the device epi layer 14Z, the depth 306 of the modified portion 304 of the modified SJ pillar 302 would be about 13 µm. In other words, in certain embodiments, the modified portion 304 may be confined to one of the device layer pillars 64B in the intermediate area 8 of the device epi layer 14Z nearest the termination area 10 of the device. For such embodiments, the modified portion 304 of the modified SJ pillar 302 is entirely contained within the device epi layer 14Z, and only the doping of the portion of the modified SJ pillar 302 in the device epi layer 14Z is reduced relative to the remainder of the modified SJ pillar 302 or the other n-type SJ pillars 62A of the active area 6, which simplifies fabrication of the device 300. In certain embodiments, the thickness 65Z of the device epi layer 14Z may be between 2 µm and 15 µm, such as between 2 µm and 10 µm, or between 10 µm and 15 µm.

Figure 17A:
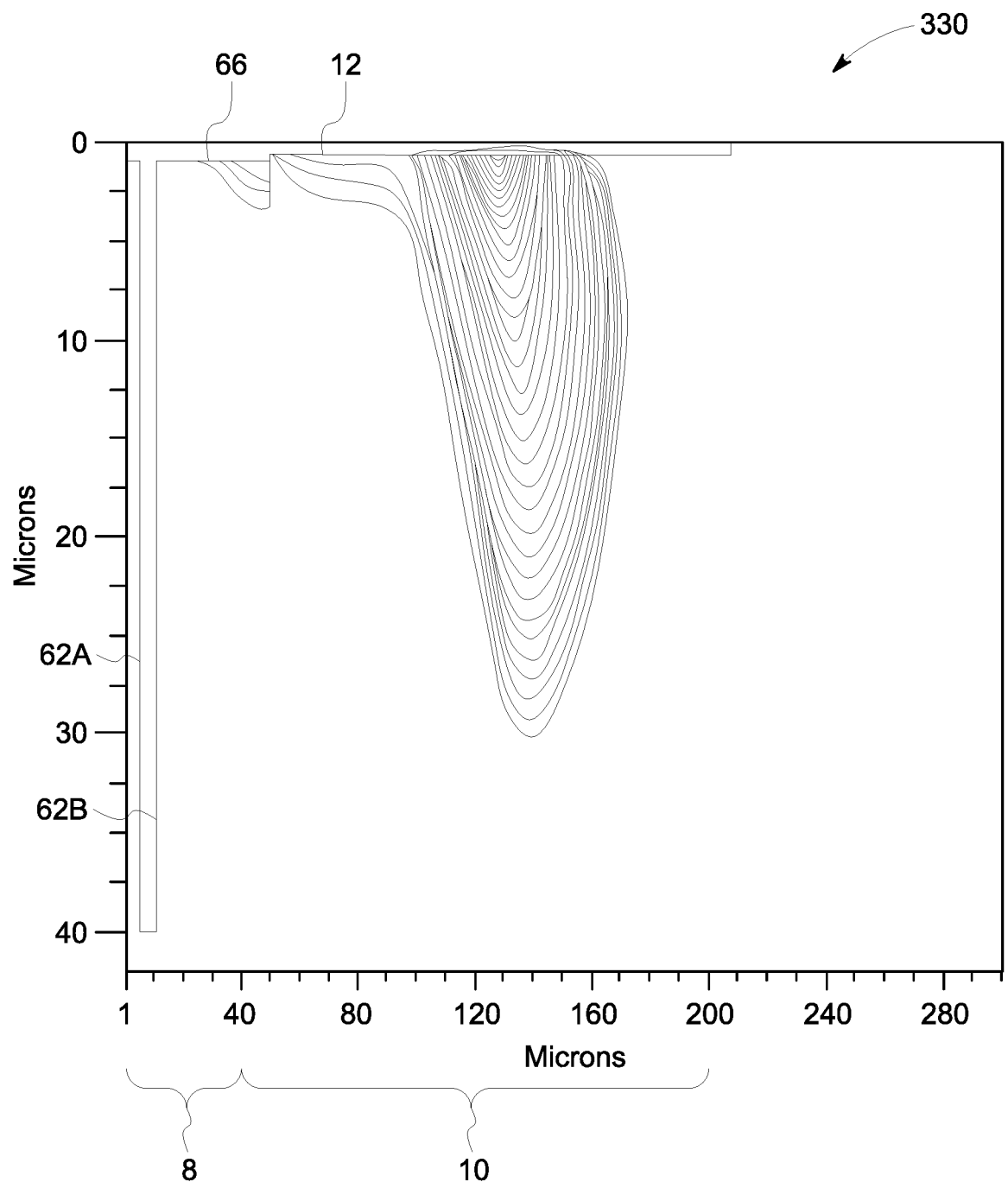
FIGS. 17A and 17B respectively illustrate impact generation rates under reverse bias conditions for embodiments of the SiC-SJ device of FIG. 13 that break down in the termination area and in the active area of the device, in accordance with aspects of the present technique.
Figure 17B:
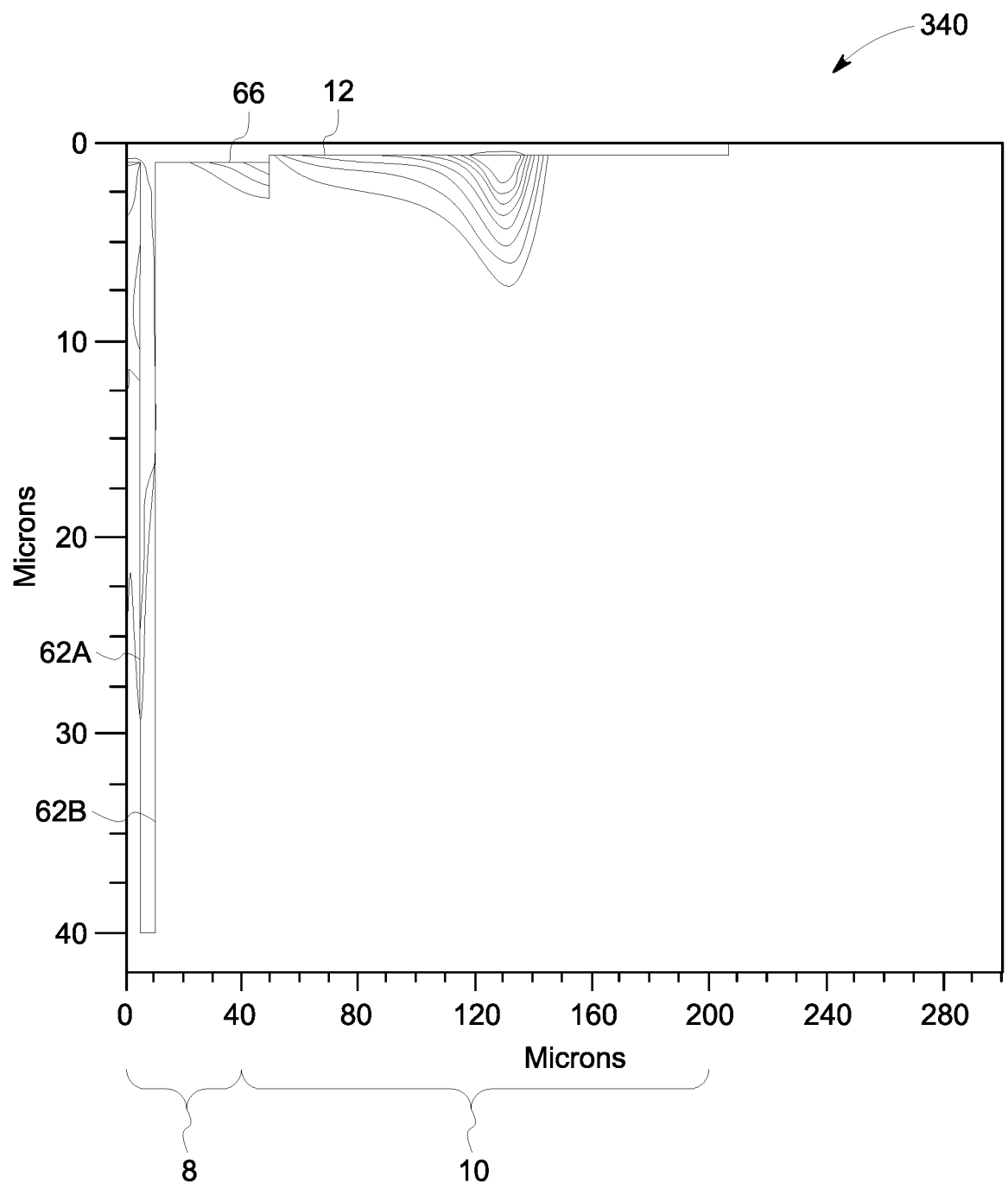

It may be appreciated that, in general, it is desirable that breakdown occurs uniformly and over a relatively large device area/volume. As such, based on the data presented in FIG. 16, it is presently recognized that a device designer can use the depth 306 of the modified portion 304 of the modified SJ pillar 302 as one method of controlling where breakdown with occur within the device 300. FIGS. 17A and 17B are graphs illustrating impact generation rates for embodiments of the SiC-SJ device 300 represented in FIG. 16. More specifically, FIG. 17A is a graph 330 illustrating impact generation rates for an embodiment of the SiC-SJ device 300 having a depth 306 of the modified portion 304 of the modified SJ pillar 302 of 13.5 µm and, as such, breakdown occurs at the JTE 12 in the termination area 10. In contrast, FIG. 17B is a graph 340 illustrating impact generation rates for the SiC-SJ device 300 having a depth 306 of the modified portion 304 of the modified SJ pillar 302 of 12 µm and, as such, breakdown occurs at the top of the n-type SJ pillars 62A in the active area 6 and intermediate area 8 of the device.

Figure 18:
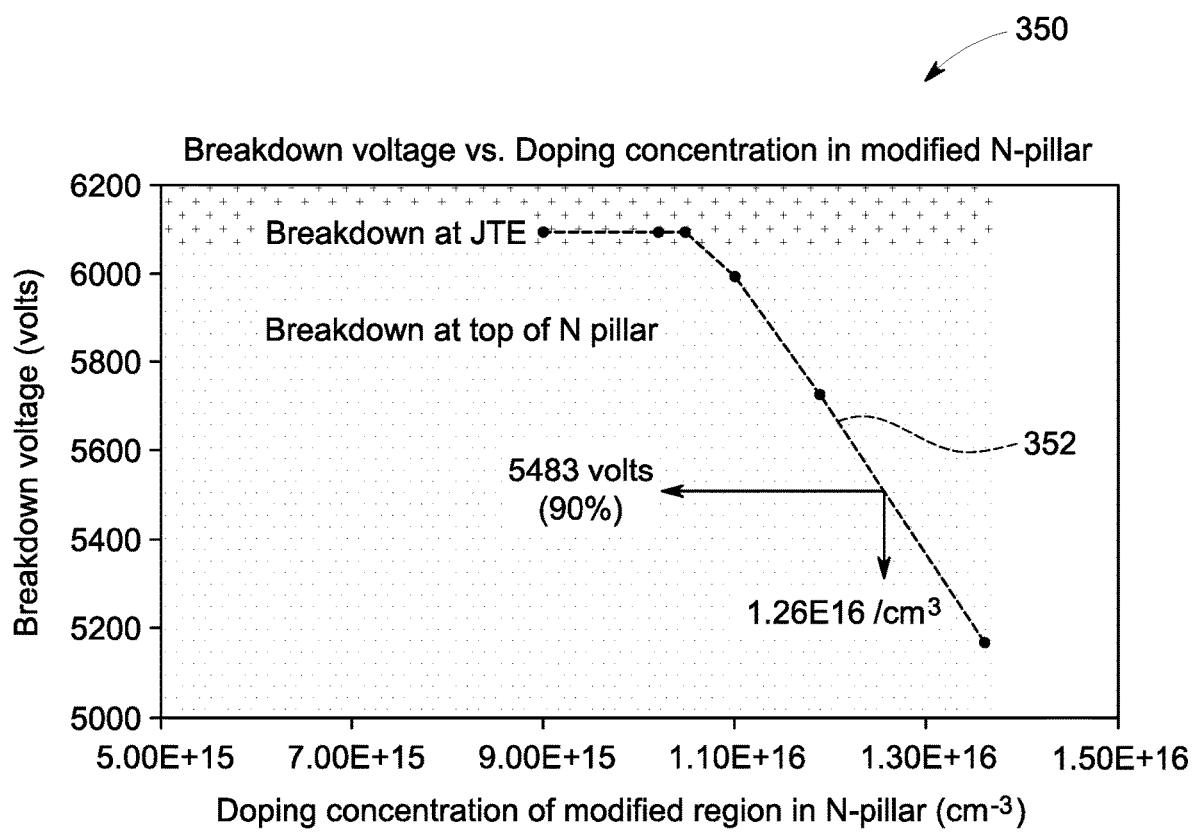
FIG. 18 is a graph illustrating breakdown voltage as a function of doping concentration in the doping modification of the modified SJ pillar, in accordance with aspects of the present technique.

In addition to the depth 306 of the modified portion 304, it is also presently recognized that the doping of the modified portion 304 of the modified SJ pillar 302 also affects the breakdown properties of the SiC-SJ device 300. FIG. 18 is a graph 350 illustrating breakdown voltage as a function of the doping concentration in modified portion 304 of the modified SJ pillar 302. The data of the graph 350 is modeled based on the model parameters described above, except that the depth 306 of the modified portion 304 is held at a constant value of 13.5 µm. The graph 350 also includes a curve 352 representing the breakdown voltages of embodiments of the SiC-SJ device 300 having different doping concentrations in the modified portion 304 of the modified SJ pillar 302, which corresponds with the data of Table 2.

TABLE 2

Data corresponding to the curve 352 of FIG. 18.

| Doping of modified portion of modified SJ pillar (cm$^{-3}$) | BV (volts) |
|---|---|
| $9.00 \times 10^{15}$ | 6092 |
| $1.02 \times 10^{16}$ | 6092 |
| $1.05 \times 10^{16}$ | 6092 |
| $1.10 \times 10^{16}$ | 5995 |
| $1.19 \times 10^{16}$ | 5725 |
| $1.36 \times 10^{16}$ | 5170 |

As illustrated by the graph 350 of FIG. 18, for embodiments of the SiC-SJ device 300 having a doping concentration in the modified portion 304 of the modified SJ pillar 302 that is greater than about $1.05 \times 10^{16}$ cm$^{-3}$, breakdown occurs at the top of the n-type SJ pillars 34A in the active area 6 and the intermediate area 8 of the device. In contrast, for embodiments having a doping concentration in the modified portion 304 of the modified SJ pillar 302 that is less than or equal to about $1.05 \times 10^{16}$ cm$^{-3}$, breakdown occurs at the JTE 12 in the termination area 10 of the device. Additionally, embodiments having a doping concentration in the modified portion 304 of the modified SJ pillar 302 that is less than or equal to about $1.05 \times 10^{16}$ cm$^{-3}$ demonstrate a breakdown voltage that is equivalent to the entitlement of the device 300. As such, in one example, an embodiment of the SiC-SJ device 300 may be fabricated having a breakdown voltage that is approximately 90% of the entitlement of the SiC-SJ device 300 when the doping concentration in the modified portion 304 of the modified SJ pillar 302 is about $1.26 \times 10^{16}$ cm$^{-3}$.

Technical effects of the present approach include effective termination of SJ devices. Additionally, the disclosed termination designs consume a relatively smaller portion of the die area relative to typical junction termination designs and are relatively low-cost to fabricate. For example, the disclosed junction termination designs may be designed with a width such that the ratio of the termination width to the one dimensional (1-D) depletion width is minimized (e.g., less than 5, such as between 2.75 and 5, between 2.75 and 4, between 2.75 and 3), which results in a device having increased die area available for the active area, while also providing a breakdown voltage that is near or at device entitlement. Additionally, certain SJ pillars (e.g., device pillars) near the termination area can include an upper portion having a reduced doping concentration relative to the other SJ pillars of the device, which can increase the breakdown voltage of the device 300. Furthermore, the depth and the doping concentration of this modified portion of these SJ pillars may be varied to adjust the breakdown voltage, as well as the location at which breakdown occurs, for SJ devices.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A super-junction (SJ) device, comprising:
a first epitaxial (epi) layer that forms a first SJ layer of the SJ device; and
a second epi layer disposed on the first SJ layer that forms a device layer of the SJ device, wherein an active area of the first and second epi layers includes a first set of SJ pillars comprising a first doping concentration of a first conductivity type and a second set of SJ pillars comprising the first doping concentration of a second conductivity type, wherein an intermediate area of the first epi layer includes a SJ pillar comprising the first doping concentration of the first conductivity type and an intermediate area of the second epi layer includes a modified pillar comprising a second doping concentration of the first conductivity type that is less than the first doping concentration, wherein a termination area of the first and second epi layers comprises a minimized epi doping concentration of the first conductivity type that is less than the first doping concentration and the second doping concentration, wherein the modified pillar is disposed more proximate to the termination area of the second epi layer than the first set of SJ pillars of the second epi layer, and wherein the termination area of the second epi layer includes a plurality of floating regions of the second conductivity type that form a junction termination of the SJ device.

2. The SJ device of claim 1, wherein the junction termination comprises a floating field ring (FFR), a single zone junction termination extension (JTE), a multiple zone JTE, a graded zone JTE, a multiple floating zone JTE, a space modulated JTE, or a combination thereof.

3. The SJ device of claim 1, wherein the minimized epi doping concentration is at least 50% less than the first doping concentration.

4. The SJ device of claim 1, wherein a thickness of the first epi layer is between 2 microns (μm) and 15 μm.

5. The SJ device of claim 1, wherein the first epi layer is disposed on an underlying wide band gap substrate layer.

6. The SJ device of claim 1, wherein the first epi layer is disposed on a third epi layer that forms a second SJ layer of the SJ device, wherein an active area of the third epi layer includes the first set of SJ pillars comprising the first doping concentration of the first conductivity type and the second set of SJ pillars comprising the first doping concentration of the second conductivity type, and wherein the termination area of the third epi layer comprises the minimized epi doping concentration of the first conductivity type.

7. The SJ device of claim 1, wherein the intermediate area comprises an intermediate well region of the second conductivity type disposed adjacent to a surface of the second epi layer, and wherein the modified pillar is disposed directly below the intermediate well region and extends through a remainder of a thickness of the second epi layer.

8. The SJ device of claim 7, wherein the active area of the second epi layer comprises a well region of the second conductivity type disposed adjacent to the intermediate well region.

9. The SJ device of claim 8, wherein the well region extends vertically from the surface of the second epi layer to contact at least one of the second set of SJ pillars of the second epi layer.

10. The SJ device of claim 8, wherein the well region, the intermediate well region, and the plurality of floating regions each vertically extend from the surface of the second epi layer to the same depth within the second epi layer.

11. The SJ device of claim 7, wherein the intermediate well region comprises a width that extends from a first edge of the intermediate area adjacent to the active area to a second edge of the intermediate area adjacent to the termination area.

12. The SJ device of claim 1, wherein the intermediate area of the first and second epi layers each comprise a second SJ pillar having the first doping concentration of the second conductivity type disposed adjacent to the termination area.

13. The SJ device of claim 12, wherein the intermediate area comprises an intermediate well region of the second conductivity type disposed adjacent to a surface of the second epi layer, and the second SJ pillars in the intermediate area of the first and second epi layers are vertically aligned with an edge of the intermediate well region adjacent to the termination area.

14. The SJ device of claim 1, wherein the SJ pillar in the intermediate area of the first epi layer is vertically aligned with the modified pillar in the second epi layer.

15. The SJ device of claim 1, wherein the minimized epi doping concentration is less than or equal to $3 \times 10^{15}$ cm$^{-3}$ and the second doping concentration is greater than $1.05 \times 10^{16}$ cm$^{-3}$.

16. A silicon carbide (SiC) super-junction (SJ) device, comprising:
a first super-junction (SJ) layer formed in a first epitaxial (epi) layer of the SiC-SJ device, wherein a termination area of the first epi layer comprises a minimized epi doping concentration of a first conductivity type, and wherein the minimized epi doping concentration is less than or equal to $1.5 \times 10^{15}$ cm$^{-3}$; and
a device layer formed in a second epi layer of the SiC-SJ device, wherein the second epi layer is disposed on the first SJ layer, and wherein a termination area of the device layer comprises the minimized epi doping concentration of the first conductivity type and a plurality of floating regions of a second conductivity type that form a junction termination of the SiC-SJ device;
wherein an active layer of the first and second epi layer includes a first set of SJ pillars comprising a first doping concentration of the first conductivity type and a second set of SJ pillars comprising the first doping concentration of the second conductivity type, wherein an intermediate area of the first epi layer includes a SJ pillar comprising the first doping concentration of the first conductivity type and an intermediate area of the second epi layer includes a modified pillar comprising a second doping concentration of the first conductivity type that is less than the first doping concentration, wherein the modified pillar is disposed more proximate to the termination area of the device layer than the first set of SJ pillars of the second epi layer, and wherein the minimized epi doping concentration is less than the first doping concentration and the second doping concentration.

17. The SiC-SJ device of claim 16, wherein the first doping concentration is less than or equal to $1\times10^{17}$ cm$^{-3}$ and greater than or equal to $5\times10^{15}$ cm$^{-3}$ of the first conductivity type.

18. The SiC-SJ device of claim 16, wherein each of the plurality of floating regions has a respective width, and wherein the respective width of each of the plurality of floating regions is between 0.8 microns (μm) and 5 μm.

19. The SiC-SJ device of claim 16, wherein the junction termination comprises a junction termination extension (JTE), wherein the JTE comprises a width between 2.75 and 5 times a combined thickness of the first and second epi layers.

20. The SiC-SJ device of claim 19, wherein an integrated charge of the JTE is greater than or equal to $6\times10^{12}$ cm$^{-2}$ and less than or equal to $3\times10^{13}$ cm$^{-2}$.

21. The SiC-SJ device of claim 16, wherein the SiC-SJ device comprises a metal-oxide-semiconductor field-effect transistor (MOSFET), a junction field effect transistor (JFET), a bipolar junction transistor (BJTs), or a diode.

* * * * *